US012075611B2

(12) United States Patent
Lee et al.

(10) Patent No.: US 12,075,611 B2
(45) Date of Patent: Aug. 27, 2024

(54) SEMICONDUCTOR MEMORY DEVICE

(71) Applicant: Samsung Electronics Co., Ltd., Suwon-si (KR)

(72) Inventors: Wonsok Lee, Suwon-si (KR); Min Tae Ryu, Hwaseong-si (KR); Woo Bin Song, Hwaseong-si (KR); Kiseok Lee, Hwaseong-si (KR); Minsu Lee, Seongnam-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 213 days.

(21) Appl. No.: 17/481,583

(22) Filed: Sep. 22, 2021

(65) Prior Publication Data
US 2022/0246180 A1    Aug. 4, 2022

(30) Foreign Application Priority Data
Feb. 1, 2021    (KR) .................. 10-2021-0014288

(51) Int. Cl.
*H10B 12/00*    (2023.01)
*G11C 5/06*    (2006.01)
*H01L 29/06*    (2006.01)

(52) U.S. Cl.
CPC .......... *H10B 12/315* (2023.02); *G11C 5/063* (2013.01); *H01L 29/0607* (2013.01); *H10B 12/05* (2023.02); *H10B 12/50* (2023.02)

(58) Field of Classification Search
CPC ..... G11C 11/4097; G11C 5/025; G11C 5/063; G11C 7/02; G11C 8/14; H01L 29/0607; H01L 29/66969; H01L 29/7827; H10B 12/05; H10B 12/053; H10B 12/30; H10B 12/315; H10B 12/482; H10B 12/485; H10B 12/488; H10B 12/50
See application file for complete search history.

(56) References Cited

U.S. PATENT DOCUMENTS

| | | | |
|---|---|---|---|
| 9,679,815 B2 | 6/2017 | Lee et al. | |
| 10,388,658 B1* | 8/2019 | Ramaswamy | ....... H10B 12/488 |
| 10,546,811 B2 | 1/2020 | Sukekawa | |
| 2008/0121960 A1* | 5/2008 | Ohuchi | .............. H10B 12/0335 |
| | | | 257/E29.345 |

(Continued)

FOREIGN PATENT DOCUMENTS

TW            201637099 A       10/2016

*Primary Examiner* — Michelle Mandala
*Assistant Examiner* — Kevin Quinto
(74) *Attorney, Agent, or Firm* — Muir Patent Law, PLLC

(57) ABSTRACT

A semiconductor memory includes a bit line extending in a first direction, first and second active patterns, which are alternately disposed in the first direction and on the bit line, and each of which includes a horizontal portion and a vertical portion, first word lines disposed on the horizontal portions of the first active patterns to cross the bit line, second word lines disposed on the horizontal portions of the second active patterns to cross the bit line, and an intermediate structure provided in a first gap region between the first and second word lines or in a second gap region between the vertical portions of the first and second active patterns. The first and second active patterns, which are adjacent to each other, may be disposed to be symmetric with respect to each other.

15 Claims, 30 Drawing Sheets

(56) References Cited

U.S. PATENT DOCUMENTS

| | | | |
|---|---|---|---|
| 2012/0056255 A1* | 3/2012 | Sukekawa | H10B 12/053 |
| | | | 257/329 |
| 2013/0087842 A1 | 4/2013 | Kim et al. | |
| 2019/0296018 A1 | 9/2019 | Cho et al. | |
| 2019/0393223 A1 | 12/2019 | Sharma et al. | |
| 2020/0043941 A1* | 2/2020 | Kim | H10B 43/20 |
| 2020/0105892 A1 | 4/2020 | Haratipour et al. | |
| 2020/0111800 A1 | 4/2020 | Ramaswamy | |
| 2020/0144270 A1 | 5/2020 | Hwang et al. | |
| 2020/0161294 A1 | 5/2020 | Lee et al. | |
| 2020/0219804 A1 | 7/2020 | Jezewski et al. | |
| 2020/0227410 A1 | 7/2020 | Yoon et al. | |

* cited by examiner

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2021-0014288, filed on Feb. 1, 2021, in the Korean Intellectual Property Office, the entire contents of which are hereby incorporated by reference.

BACKGROUND

The present disclosure relates to a semiconductor memory device, and in particular, to a semiconductor memory device including vertical channel transistors and a method of fabricating the same.

As a design rule of a semiconductor device decreases, it is possible to increase an integration density and an operation speed of the semiconductor device, but new technologies are desirable to increase or maintain a production yield. Recently, semiconductor devices with vertical channel transistors have been suggested to increase an integration density of a semiconductor device with lower resistance and higher current driving characteristics of the transistor.

SUMMARY

An embodiment of the inventive concept provides a semiconductor memory device with improved electric characteristics and an increased integration density.

According to an embodiment of the present inventive concept, a semiconductor memory device includes a bit line extending in a first direction, a plurality of first active patterns and a plurality of second active patterns alternately disposed in the first direction and overlapping the bit line, each of the plurality of first and second active patterns including a horizontal portion and a vertical portion, a plurality of first word lines extending in a second direction different from the first direction and overlapping the bit line, each of the plurality of first word lines being disposed on a horizontal portion of a corresponding one of the plurality of first active patterns, a plurality of second word lines extending in the second direction and overlapping the bit line, each of the plurality of second word lines being disposed on a horizontal portion of a corresponding one of the plurality of second active patterns, and a plurality of intermediate structures, each intermediate structure being provided in at least one of a first gap region between a corresponding first word line of the plurality of first word lines and a corresponding second word line, adjacent to the corresponding first word line, of the plurality of second word lines, and a second gap region between a vertical portion of a corresponding first active pattern of the plurality of first active patterns and a vertical portion of a corresponding second active pattern, adjacent to the corresponding first active pattern, of the plurality of second active patterns.

According to an embodiment of the present inventive concept, a semiconductor memory device includes a bit line extending in a first direction, a plurality of active patterns alternately disposed in the first direction and overlapping the bit line, each active pattern including a horizontal portion and a vertical portion, a plurality of first word lines extending in a second direction different from the first direction and overlapping the bit line, each first word line being disposed on a horizontal portion of a corresponding one of the plurality of active patterns, and a plurality of second word lines extending in the second direction and overlapping the bit line, each second word line being disposed on a horizontal portion of a corresponding one of the plurality of active patterns. A pair of one of the plurality of first word lines and one of the plurality of second word lines, which are adjacent to each other, are spaced apart from each other by a first distance. Vertical portions of a pair of active patterns of the plurality of active patterns, which are adjacent to each other, are spaced apart from each other by a second distance that is larger than the first distance.

According to an embodiment of the present inventive concept, a semiconductor memory device includes a peripheral circuit structure including a plurality of peripheral circuits on a semiconductor substrate and a lower insulating layer covering the plurality of peripheral circuits, a plurality of bit lines provided on the peripheral circuit structure and extended in a first direction, a plurality of first active patterns and a plurality of second active patterns alternately disposed in the first direction and overlapping a first bit line of the plurality of bit lines, each of the plurality of first and second active patterns including a horizontal portion and a vertical portion, a plurality of first word lines extending in a second direction different from the first direction and overlapping the plurality of bit lines, each of the plurality of first word lines being disposed on a horizontal portion of a corresponding one of the plurality of first active patterns, a plurality of second word lines extending in the second direction and overlapping the plurality of bit lines, each of the plurality of second word lines being disposed on a horizontal portion of a corresponding one of the plurality of second active patterns, a plurality of first gate insulating patterns, each first gate insulating pattern being disposed between a corresponding one of the plurality of first active patterns and a first side surface of a corresponding one of the plurality of first word lines and between the corresponding one of the plurality of first active patterns and a bottom surface of the corresponding one of the plurality of first word lines, a plurality of second gate insulating patterns, each second gate insulating pattern being disposed between a corresponding one of the plurality of second active patterns and a second side surface of a corresponding one of the plurality of second word lines and between the corresponding one of the plurality of second active patterns and a bottom surface of the corresponding one of the plurality of second word lines, a first insulating pattern filling a space between a pair of one the plurality of first word lines and one of the plurality of second word lines, which are adjacent to each other, a second insulating pattern defining an air gap between vertical portions of a pair of one of the plurality of first active patterns and one of the plurality of second active patterns, which are adjacent to each other, an interlayer insulating layer disposed on the first and second insulating patterns to cover top surfaces of the plurality of first and second active patterns, a plurality of landing pads provided to penetrate the interlayer insulating layer, each landing pad being connected to a vertical portion of a corresponding one of the plurality of first and second active patterns, and a plurality of data storage patterns on the plurality of landing pads, respectively.

A semiconductor memory device includes a bit line extending in a first direction, a plurality of word line pairs of a first word line and a second word line extending parallel to each other in a second direction different from the first direction, and a plurality of active pattern pairs of a first active pattern and a second active pattern, the plurality of active pattern pairs being arranged in the first direction and overlapping the bit line, each active pattern pair being disposed between a first word line and a second word line of a respective word line pair, and each of the first and second active patterns including a bottom portion and a vertical portion. A first word line of each word line pair is disposed on a bottom portion and a vertical portion of a first active pattern of a respective active pattern pair. A second word line of each word line pair is disposed on a bottom portion and a vertical portion of a second active pattern of a respective active pattern pair. Two adjacent word line pairs are spaced apart from each other at a first distance. A first active pattern and a second active pattern of each active pattern pair is spaced apart from each other at a second distance different from the first distance.

DETAILED DESCRIPTION

Example embodiments of the inventive concepts will now be described more fully with reference to the accompanying drawings, in which example embodiments are shown.

Figure 1:
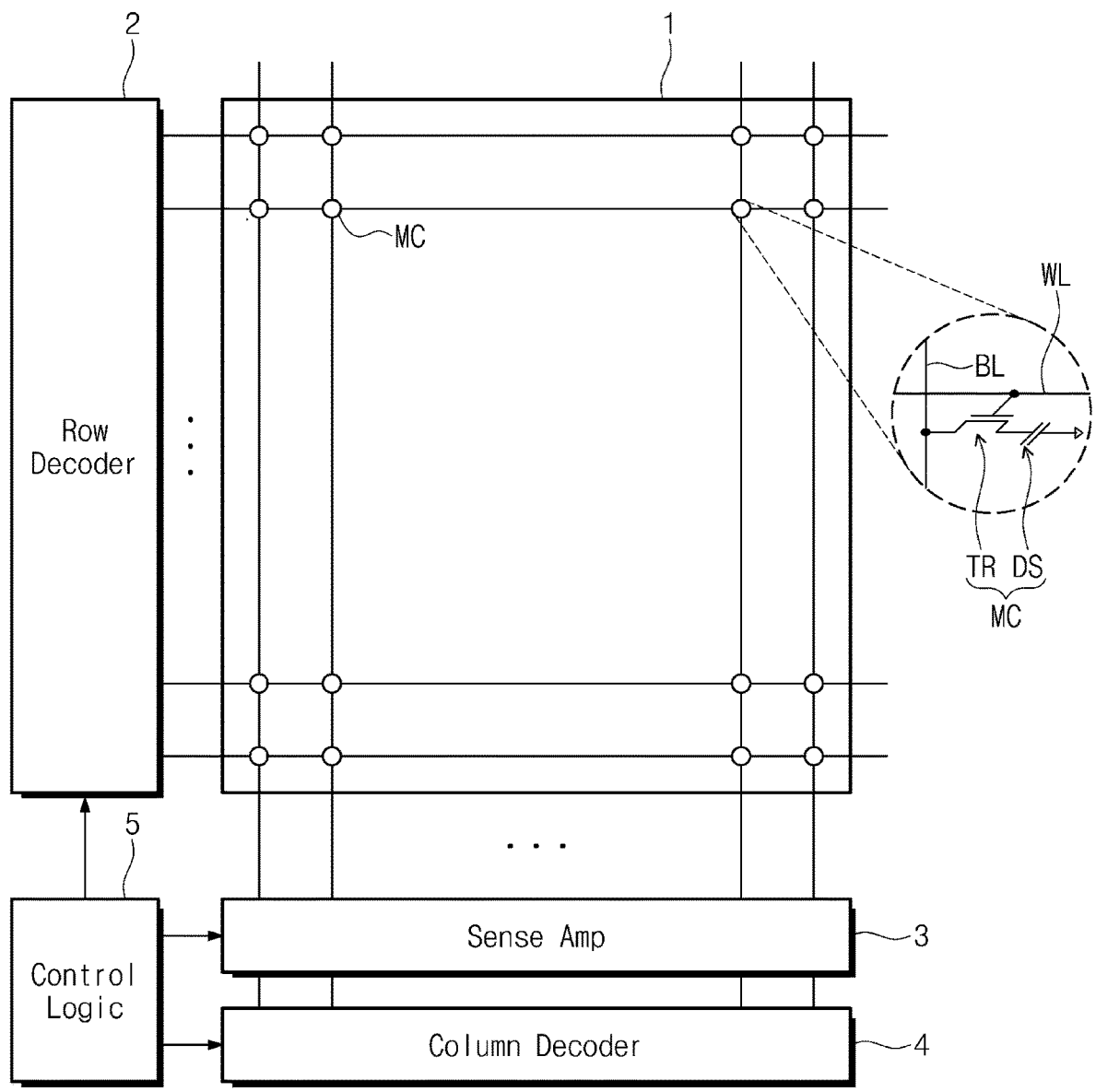
FIG. 1 is a block diagram illustrating a semiconductor memory device including a semiconductor device according to an embodiment of the inventive concept.

FIG. 1 is a block diagram illustrating a semiconductor memory device including a semiconductor device according to an embodiment of the inventive concept.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC, which are two-dimensionally or three-dimensionally arranged. Each of the memory cells MC may be provided between and connected to a word line WL and a bit line BL, which are disposed to cross each other.

Each of the memory cells MC may include a selection element TR and a data storage element DS, which are electrically connected to each other in series. The selection element TR may be provided between and connected to the data storage element DS and the word line WL, and the data storage element DS may be connected to the bit line BL through the selection element TR. The selection element TR may be a field effect transistor (FET), and the data storage element DS may be realized using at least one of a capacitor, a magnetic tunnel junction pattern, or a variable resistor. As an example, the selection element TR may include a transistor whose gate electrode is connected to the word line WL and whose drain/source terminals are connected to the bit line BL and the data storage element DS, respectively.

The row decoder 2 may be configured to decode address information, which is input from the outside, and to select one of the word lines WL of the memory cell array 1, based on the decoded address information. The address information decoded by the row decoder 2 may be provided to a row driver (not shown), and the row driver may provide respective voltages to the selected one of the word lines WL and the unselected ones of the word lines WL, in response to the control of a control circuit.

The sense amplifier 3 may be configured to sense, amplify, and output a difference in voltage between one of the bit lines BL, which is selected based on address information decoded by the column decoder 4, and a reference bit line.

The column decoder 4 may provide a data transmission path between the sense amplifier 3 and an external device (e.g., a memory controller). The column decoder 4 may be configured to decode address information, which is input from the outside, and to select one of the bit lines BL, based on the decoded address information.

The control logic 5 may be configured to generate control signals, which are used to control data-writing or data-reading operations on the memory cell array 1.

Figure 2:
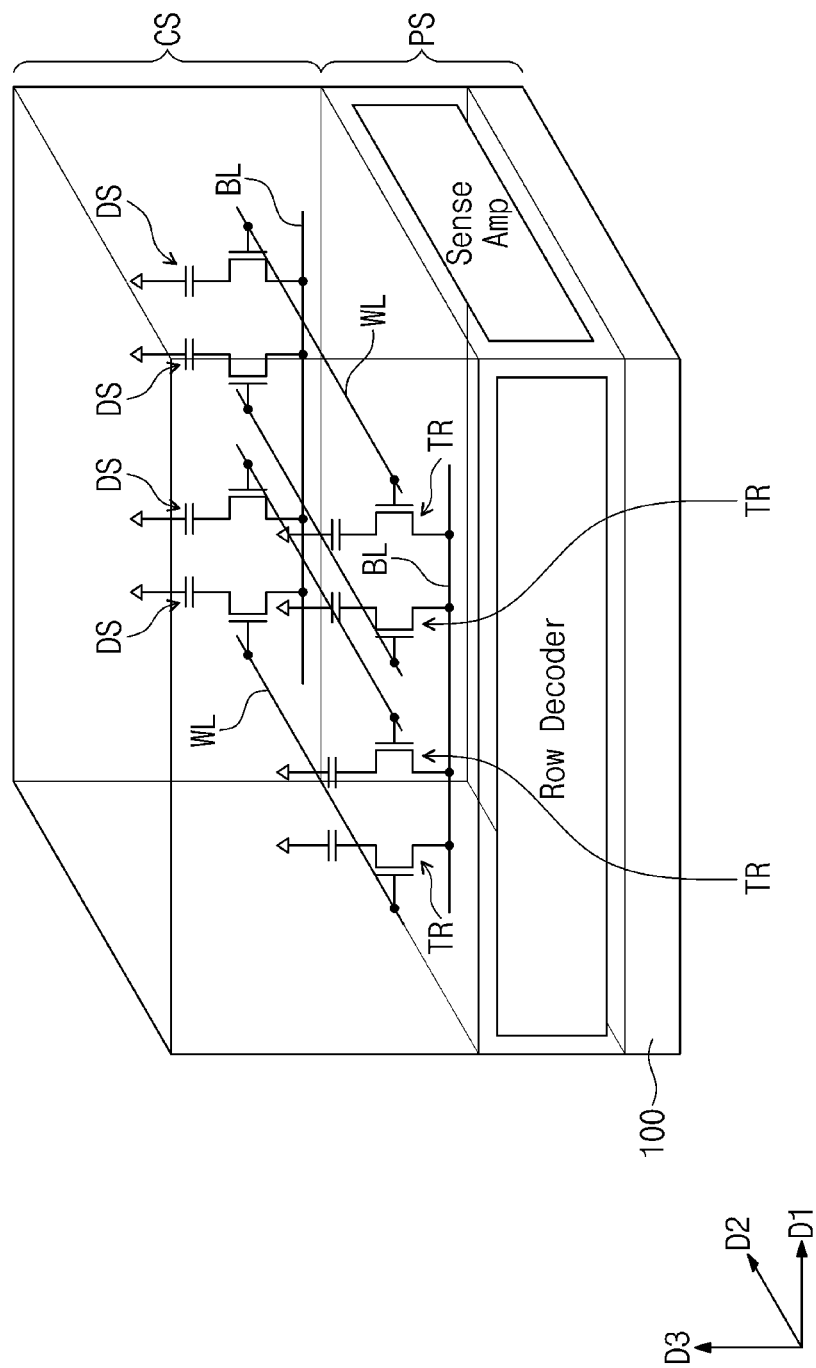
FIGS. 2 and 3 are perspective views schematically illustrating semiconductor memory devices according to an embodiment of the inventive concept.
Figure 3:
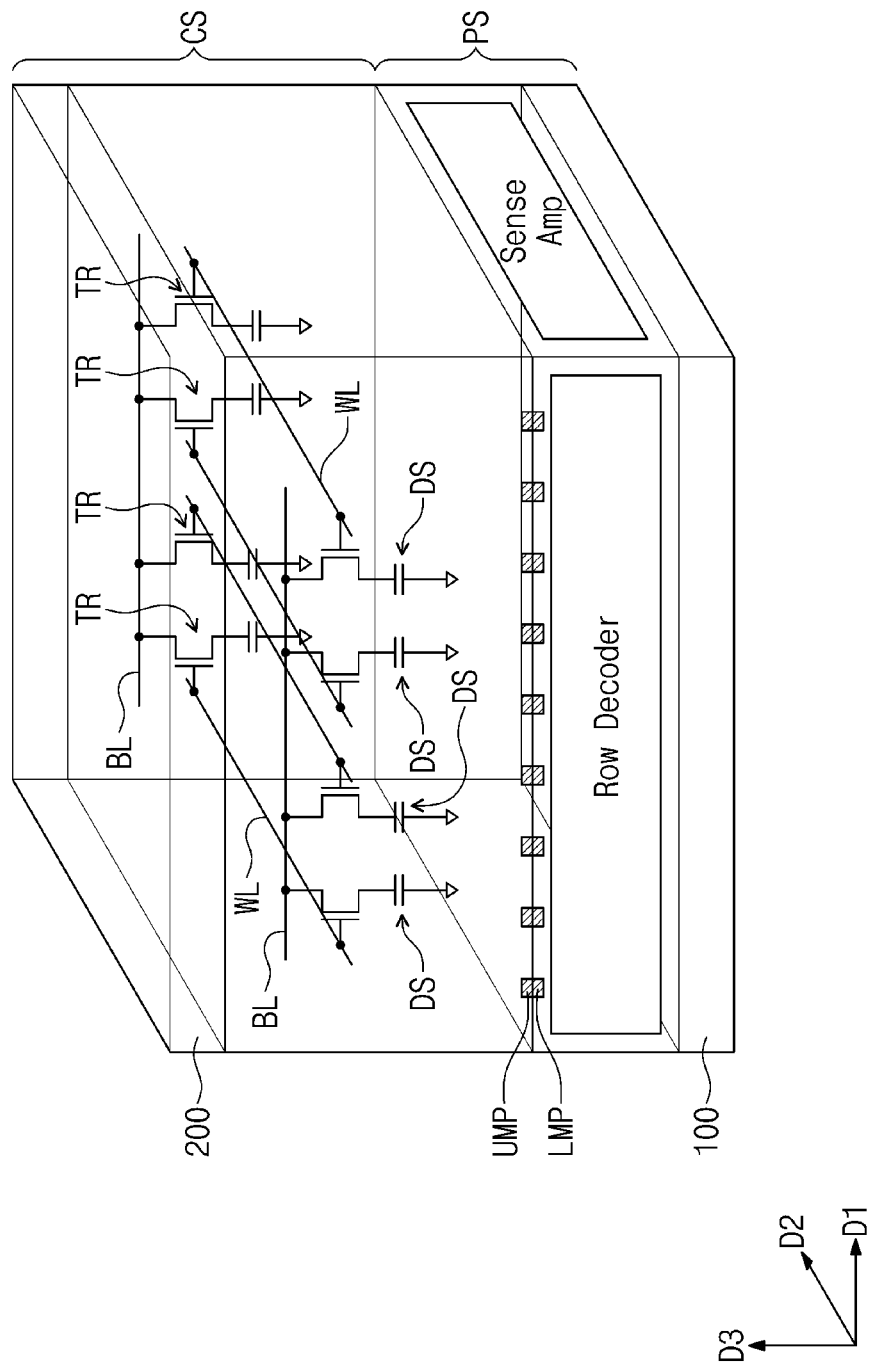

FIGS. 2 and 3 are perspective views schematically illustrating semiconductor memory devices according to an embodiment of the inventive concept.

Referring to FIGS. 2 and 3, the semiconductor memory device may include a peripheral circuit structure PS and a cell array structure CS, which is connected to the peripheral circuit structure PS.

The peripheral circuit structure PS may include core and peripheral circuits, which are formed on a semiconductor substrate 100. The core and peripheral circuits may include the row and column decoders 2 and 4, the sense amplifier 3, and the control logics 5 as described with reference to FIG. 1.

The cell array structure CS may include the memory cell array 1 (e.g., see FIG. 1) including the memory cells MC (e.g., see FIG. 1), which are two- or three-dimensionally arranged on a plane parallel to two different directions (e.g., first and second directions D1 and D2). Each of the memory cells MC (e.g., see FIG. 1) may include the selection element TR and the data storage element DS, as described above.

In an embodiment, a vertical channel transistor (VCT) may be provided as the selection element TR of each of the memory cells MC (e.g., see FIG. 1). The vertical channel transistor may refer to a transistor whose channel region is elongated in a direction perpendicular to a top surface of the semiconductor substrate 100 (i.e., in a third direction D3). A capacitor may be provided as the data storage element DS of each of the memory cells MC (e.g., see FIG. 1).

In the embodiment of FIG. 2, the peripheral circuit structure PS may be provided on the semiconductor substrate 100, and the cell array structure CS may be provided on the peripheral circuit structure PS.

In the embodiment of FIG. 3, the peripheral circuit structure PS may be provided on a first semiconductor substrate 100, and the cell array structure CS may be provided on a second semiconductor substrate 200.

Lower metal pads LMP may be provided at the topmost level of the peripheral circuit structure PS. The lower metal pads LMP may be electrically connected to the core and peripheral circuits (e.g., 2, 3, 4, and 5 of FIG. 1).

Upper metal pads UMP may be provided at the topmost level of the cell array structure CS. The upper metal pads UMP may be electrically connected to the memory cell array (e.g., 1 of FIG. 1). The upper metal pads UMP may be in contact with and bonded to the lower metal pads LMP of the peripheral circuit structure PS. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to, or "directly disposed on" another element, or as "contacting" or "in contact with" another element, there are no intervening elements present at the point of contact.

Figure 4:
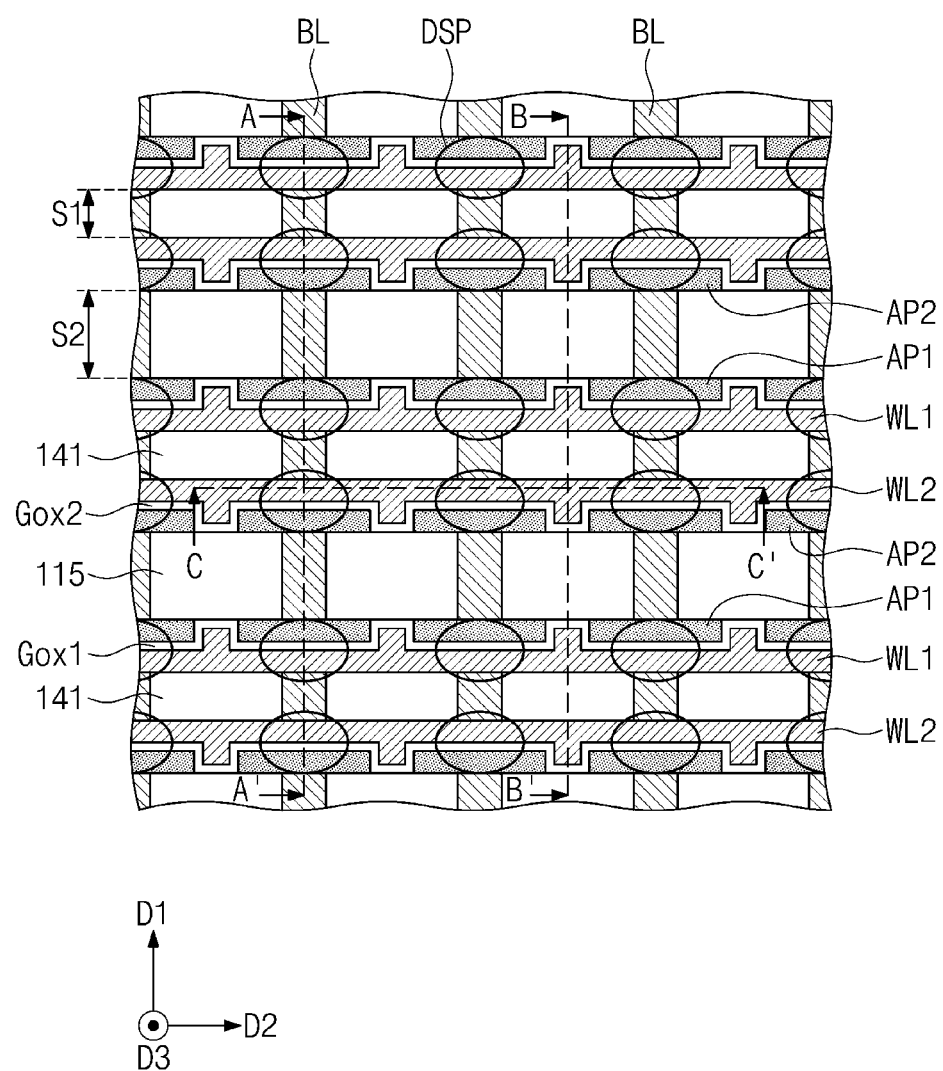
FIG. 4 is a plan view illustrating a semiconductor memory device according to an embodiment of the inventive concept.
Figure 5:
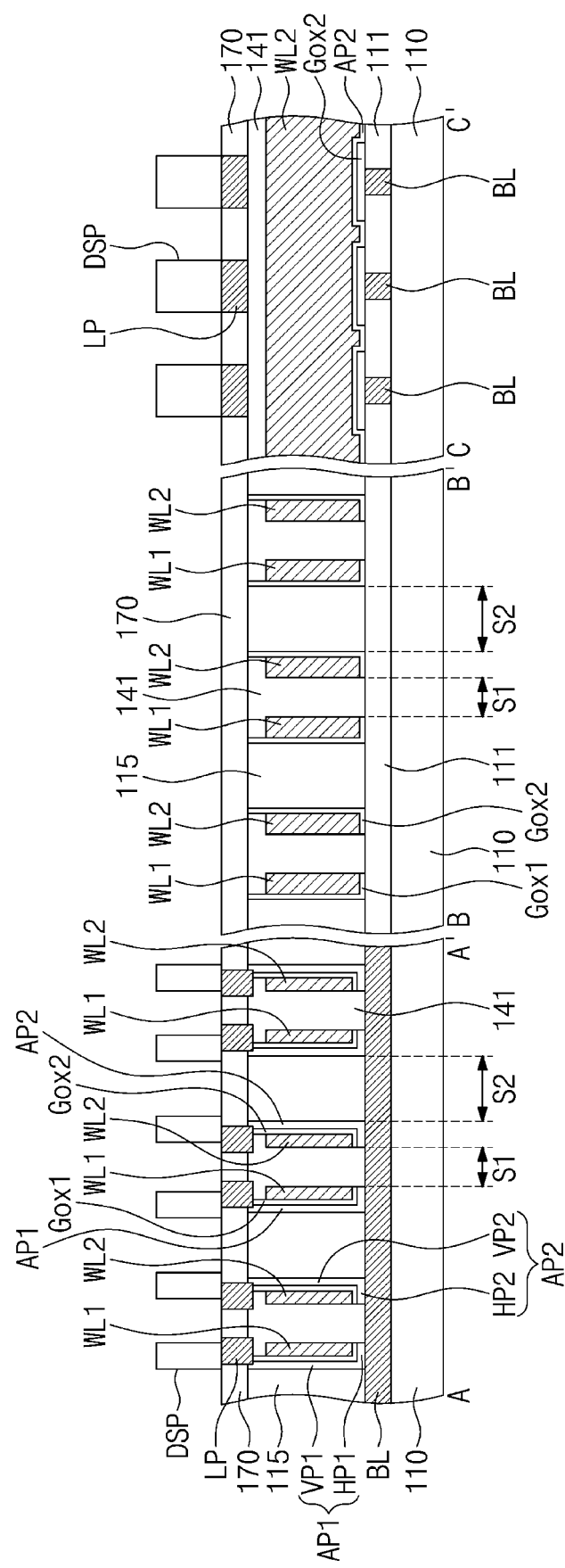
FIG. 5 is a sectional view, which is taken along lines A-A', B-B', and C-C' of FIG. 4 to illustrate a semiconductor memory device according to an embodiment of the inventive concept.

FIG. 4 is a plan view illustrating a semiconductor memory device according to an embodiment of the inventive concept. FIG. 5 is a sectional view, which is taken along lines A-A', B-B', and C-C' of FIG. 4 to illustrate a semiconductor memory device according to an embodiment of the inventive concept.

Referring to FIGS. 4 and 5, the bit lines BL may be provided on a lower insulating layer 110, may be extended in the first direction D1, and may be spaced apart from each other in the second direction D2. The bit lines BL may have a first width W1 in the second direction D2, and in an embodiment, the first width W1 may be in the range of from about 1 nm to about 50 nm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The bit lines BL may include or may be formed of at least one of, for example, doped polysilicon, metals, conductive metal nitrides, conductive metal silicides, conductive metal oxides, or combinations thereof. The bit lines BL may be formed of at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to these examples. Each of the bit lines BL may be a single- or multi-layered structure including at least one of the above materials. In an embodiment, the bit lines BL may be formed of or may include at least one of two- and three-dimensional materials. For example, the bit lines BL may be formed of or may include at least one of carbon-based two-dimensional materials (e.g., graphene), carbon-based three-dimensional materials (e.g., carbon nanotube), or combinations thereof.

An insulating gapfill pattern 111 may be provided to fill spaces between two adjacent bit lines of the bit lines BL. The insulating gapfill pattern 111 may include or may be formed of at least one of, for example, a silicon oxide layer, a silicon nitride layer, a silicon oxynitride layer, and/or a low-k dielectric layer.

A mold insulating pattern 115 may be disposed on the bit lines BL, and the mold insulating pattern 115 may be extended in the second direction D2 to cross the bit lines BL and may define trenches, which are spaced apart from each other in the first direction D1. The mold insulating pattern 115 may include or may be formed of at least one of, for example, a silicon oxide layer, a silicon nitride layer, a silicon oxynitride layer, and/or a low-k dielectric layer.

A pair of first and second active patterns AP1 and AP2 may be disposed in each of the trenches, which are defined by the mold insulating pattern 115. In each of the trenches, the first active patterns AP1 may be spaced apart from each other in the second direction D2, and the second active patterns AP2 may also be spaced apart from each other in the second direction D2. The first and second active patterns AP1 and AP2 may be alternately arranged in the first direction D1 on each of the bit lines BL. For example, the first and second active patterns AP1 and AP2 may be two-dimensionally arranged in two different directions (e.g., the first and second directions D1 and D2). In some embodiments, a plurality of pairs of first and second active patterns AP1 and AP2 may be disposed in each trench defined by the mold insulating pattern 115. The plurality pairs of first and second active patterns AP1 and AP2 may be spaced apart from each other in the second direction D2. In each pair of first and second active patterns AP1 and AP2, the first and second active patterns AP1 and AP2 may be spaced apart from each other in the first direction D1.

Each of the first active patterns AP1 may include a first horizontal portion HP1, which is disposed on the bit line BL, and a first vertical portion VP1, which is vertically extended from the first horizontal portion HP1. In some embodiments, the first horizontal portion HP1 may contact a top surface of the bit line BL, and the first vertical portion VP1 may contact a first side surface of the mold insulating pattern 115.

Each of the second active patterns AP2 may include a second horizontal portion HP2, which is disposed on the bit line BL, and a second vertical portion VP2, which is vertically extended from the second horizontal portion HP2. In some embodiments, the second horizontal portion HP2 may contact the top surface of the bit line BL, and the second vertical portion VP2 may contact a second side surface of the mold insulating pattern 115. The first side surface of the mold insulating pattern 115 and the second side surface of the mold insulating pattern 115 may be spaced apart from each other in the first direction D1. The first and second active patterns AP1 and AP2 may be formed on each bit line BL to be mirror symmetric with respect to each other.

The first and second vertical portions VP1 and VP2 may have vertical lengths in a direction perpendicular to the top surface of the semiconductor substrate 100 and may have widths in the first direction D1. The vertical length of each of the first and second vertical portions VP1 and VP2 may be about 2 to about 10 times its width, but the inventive concept is not limited to this example. The widths of the first and second vertical portions VP1 and VP2 in the first direction D1 may be in the range of from several nanometers to several tens of nanometers. For example, the widths of the first and second vertical portions VP1 and VP2 may be in the range of from 1 nm to 30 nm (in particular, from 1 nm to 10 nm).

The first and second horizontal portions HP1 and HP2 may contact the top surfaces of the bit lines BL. A thickness of the first and second horizontal portions HP1 and HP2 on the top surfaces of the bit lines BL may be substantially equal to a thickness of the first and second vertical portions VP1 and VP2 on the side surfaces of the mold insulating pattern 115. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In each of the first active patterns AP1, the first horizontal portion HP1 may be used as a first source/drain region, the uppermost end of the first vertical portion VP1 may be used as a second source/drain region, and a portion between the first and second source/drain regions may be used as a first channel region.

In each of the second active patterns AP2, the second horizontal portion HP2 may be used as a third source/drain region, and the uppermost end of the second vertical portion VP2 may be used as a fourth source/drain region, and a portion between the third and fourth source/drain regions may be used as a second channel region.

In an embodiment, the first channel region of the first active pattern AP1 may be controlled by a first word line WL1, and the second channel region of the second active pattern AP2 may be controlled by a second word line WL2. In some embodiments, a pair of first and second word lines WL1 and WL2 may be disposed in a trench defined by the mold insulating pattern 115 and between a pair of first and second active patterns AP1 and AP2. The first word line WL1 may be adjacent to the first active pattern AP1, and the second word line WL2 may be adjacent to the second active pattern AP2.

As an example, the first and second active patterns AP1 and AP2 may be formed of or may include a semiconductor material (e.g., silicon, germanium, or silicon-germanium).

As an example, the first and second active patterns AP1 and AP2 may be formed of or may include at least one of oxide semiconductor materials (e.g., $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or combinations thereof). As an example, the first and second active patterns AP1 and AP2 may be formed of or may include indium gallium zinc oxide (IGZO). The first and second active patterns AP1 and AP2 may be formed of a single layer or multiple layers made of at least one of the oxide semiconductor materials. The first and second active patterns AP1 and AP2 may be formed of or may include an amorphous, single-crystalline, or poly-crystalline oxide semiconductor material. In an embodiment, the first and second active patterns AP1 and AP2 may have a band gap energy that is greater than a band gap energy of silicon. For example, the first and second active patterns AP1 and AP2 may have a band gap energy of from about 1.5 eV to about 5.6 eV. As an example, each of the first and second active patterns AP1 and AP2 may have a band gap energy of from about 2.0 eV to about 4.0 eV to serve as a channel region of a transistor.

As an example, the first and second active patterns AP1 and AP2 may be formed of or may include at least one of two- and three-dimensional materials. For example, the first and second active patterns AP1 and AP2 may be formed of or may include at least one of carbon-based two-dimensional materials (e.g., graphene), carbon-based three-dimensional materials (e.g., carbon nanotube), or combinations thereof.

The first word lines WL1 may be provided on the first horizontal portions HP1 of the first active patterns AP1 to cross the bit lines BL and to extend in the second direction D2. For example, the first word lines WL1 may be disposed over the bit lines BL and extend in the second direction D2. The second word lines WL2 may be provided on the second horizontal portions HP2 of the second active patterns AP2 to cross the bit lines BL and to extend in the second direction D2. For example, the second word lines WL2 may be disposed over the bit lines BL and extend in the second direction D2.

The first and second word lines WL1 and WL2 may be alternately arranged in the first direction D1. Each pair of the first and second word lines WL1 and WL2 may be disposed between a corresponding pair of the first and second vertical portions VP1 and VP2 of the first and second active patterns AP1 and AP2.

Each of the first and second word lines WL1 and WL2 may have first and second side surfaces, which are opposite to each other. The first side surfaces of the first and second word lines WL1 and WL2 may be placed adjacent to the first and second vertical portions VP1 and VP2 of the first and second active patterns AP1 and AP2. The second side surfaces of the first and second word lines WL1 and WL2 may be placed to face each other. For example, the second side surfaces of the first and second word lines WL1 and WL2 may contact a first insulating pattern 141 which will be described later.

The second side surface of the first word line WL1 may be aligned to a side surface of the first horizontal portion HP1 of the first active pattern AP1. The second side surface of the second word line WL2 may be aligned to a side surface of the second horizontal portion HP2 of the second active pattern AP2.

Top surfaces of the first and second word lines WL1 and WL2 may be located at a level that is lower than top surfaces of the first and second vertical portions VP1 and VP2 of the first and second active patterns AP1 and AP2. In addition, the first and second word lines WL1 and WL2 may have a spacer-like shape. For example, each of the first and second word lines WL1 and WL2 may have a rounded top surface.

The first and second word lines WL1 and WL2 may be formed of or may include at least one of, for example, doped polysilicon, metal, a conductive metal nitride, a conductive metal silicide, a conductive metal oxide, or combinations thereof. The first and second word lines WL1 and WL2 may be formed at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to these examples. The first and second word lines WL1 and WL2 may be formed of a single- or multi-layered structure including at least one of the above materials. In an embodiment, the first and second word lines WL1 and WL2 may be formed of or may include at least one of two- and three-dimensional materials. For example, the first and second word lines WL1 and WL2 may be formed of or may include at least one of carbon-based two-dimensional materials (e.g., graphene), carbon-based three-dimensional materials (e.g., carbon nanotube), or combinations thereof.

A first gate insulating pattern Gox1 may be disposed between the first word line WL1 and the first active patterns AP1, which are arranged in the second direction D2. The first gate insulating pattern Gox1 may be interposed between the first side surface of the first word line WL1 and the first vertical portions VP1 of the first active patterns AP1 and between a bottom surface of the first word line WL1 and the first horizontal portions HP1 of the first active patterns AP1. The first gate insulating pattern Gox1 may have a substantially uniform thickness. A part of the bottom surface of the first gate insulating pattern Gox1 may contact a top surface of the lower insulating layer 110, and a part of the sidewall of the first gate insulating pattern Gox1 may contact the side surface of the mold insulating pattern 115, in a region between the first active patterns AP1 that are adjacent to each other in the second direction D2.

A second gate insulating pattern Gox2 may be disposed between the second word line WL2 and the second active patterns AP2, which are arranged in the second direction D2. The second gate insulating pattern Gox2 may be interposed between the first side surface of the second word line WL2 and the second vertical portions VP2 of the second active patterns AP2 and between a bottom surface of the second word line WL2 and the second horizontal portions HP2 of the second active patterns AP2. The second gate insulating pattern Gox2 may have a substantially uniform thickness. A part of the bottom surface of the second gate insulating pattern Gox2 may contact the top surface of the lower insulating layer 110, and a part of the sidewall of the second gate insulating pattern Gox2 may contact the side surface of the mold insulating pattern 115, in a region between the second active patterns AP2 that are adjacent to each other in the second direction D2.

The first and second gate insulating patterns Gox1 and Gox2 may be formed of or may include at least one of silicon oxide, silicon oxynitride, or high-k dielectric materials, or combinations thereof. Here, the high-k dielectric materials may have dielectric constants higher than silicon oxide and may include metal oxides or metal oxynitrides. For example, the high-k dielectric material for the gate insulating patterns Gox1 and Gox2 may include or may be formed of $HfO_2$, HfSiO, HfSiON, HfTaO, HfTiO, HfZrO, $ZrO_2$, $Al_2O_3$, or combinations thereof, but the inventive concept is not limited to these examples.

The first insulating pattern 141 may be provided to fill a space between the first and second word lines WL1 and WL2, which are adjacent to each other in the first direction D1. The first insulating pattern 141 may be provided to fill a space between the first and second horizontal portions HP1 and HP2 of the first and second active patterns AP1 and AP2. The first insulating pattern 141 may cover the top surfaces of the first and second word lines WL1 and WL2. The first insulating pattern 141 may have a top surface that is substantially coplanar with the top surfaces of the first and second vertical portions VP1 and VP2 of the first and second active patterns AP1 and AP2. The top surface of the first insulating pattern 141 may be substantially coplanar with a top surface of the mold insulating pattern 115. The first insulating pattern 141 may include or may be formed of at least one of, for example, a silicon oxide layer, a silicon nitride layer, a silicon oxynitride layer, and/or a low-k dielectric layer.

As an example, a dielectric constant of the mold insulating pattern 115 may be smaller than a dielectric constant of the first insulating pattern 141. Accordingly, it may be possible to reduce a coupling noise between the first and second active patterns AP1 and AP2, which are adjacent to each other, during an operation of the vertical channel transistors. However, in an embodiment, the mold insulating pattern 115 may be formed of or may include the same insulating material as the first insulating pattern 141.

In an embodiment, the first insulating pattern 141 may be provided to separate the first and second word lines WL1 and WL2, which are adjacent to each other, by a first distance S1. The mold insulating pattern 115 may be provided to separate the first and second active patterns AP1 and AP2, which are adjacent to each other, by a second distance S2. Here, the second distance S2 may be larger than the first distance S1. Accordingly, it may be possible to reduce a coupling noise between the first and second active patterns AP1 and AP2, which are adjacent to each other, during the operation of the vertical channel transistors. Thus, it may be possible to prevent a leakage current from increasing in a selected transistor and an unselected transistor adjacent thereto, during an operation of the semiconductor memory device.

An interlayer insulating layer 170 may be disposed on the mold insulating pattern 115 and the first insulating pattern 141.

Landing pads LP may be disposed in the interlayer insulating layer 170 and may be in contact with the first and second vertical portions VP1 and VP2 of the first and second active patterns AP1 and AP2. The landing pads LP may have various shapes, such as circular, elliptical, rectangular, square, diamond, and hexagonal shapes, when viewed in a plan view. The landing pads LP may include or may be formed at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to these examples.

In an embodiment, data storage patterns DSP may be disposed on the landing pads LP, respectively. The data storage patterns DSP may be electrically and respectively connected to the first and second vertical portions VP1 and VP2 of the first and second active patterns AP1 and AP2 through the landing pads LP. The data storage patterns DSP may be arranged in the first and second directions D1 and D2 or in the matrix shape.

In an embodiment, each of the data storage patterns DSP may be a capacitor including a bottom electrode, a top electrode, and a capacitor dielectric layer interposed therebetween. The bottom electrode may be in contact with the landing pad LP and may have various shapes, such as circular, elliptical, rectangular, square, diamond, and hexagonal shapes, when viewed in a plan view.

Alternatively, the data storage patterns DSP may be a variable resistance pattern whose resistance can be switched to one of at least two states by an electric pulse applied thereto. For example, the data storage patterns DSP may be formed of or may include at least one of phase-change materials, perovskite compounds, transition metal oxides, magnetic materials, ferromagnetic materials, or antiferromagnetic materials.

Hereinafter, other examples of the semiconductor device will be described below. However, for concise description, a previously described element may be identified by the same reference number without repeating an overlapping description thereof.

Figure 6:
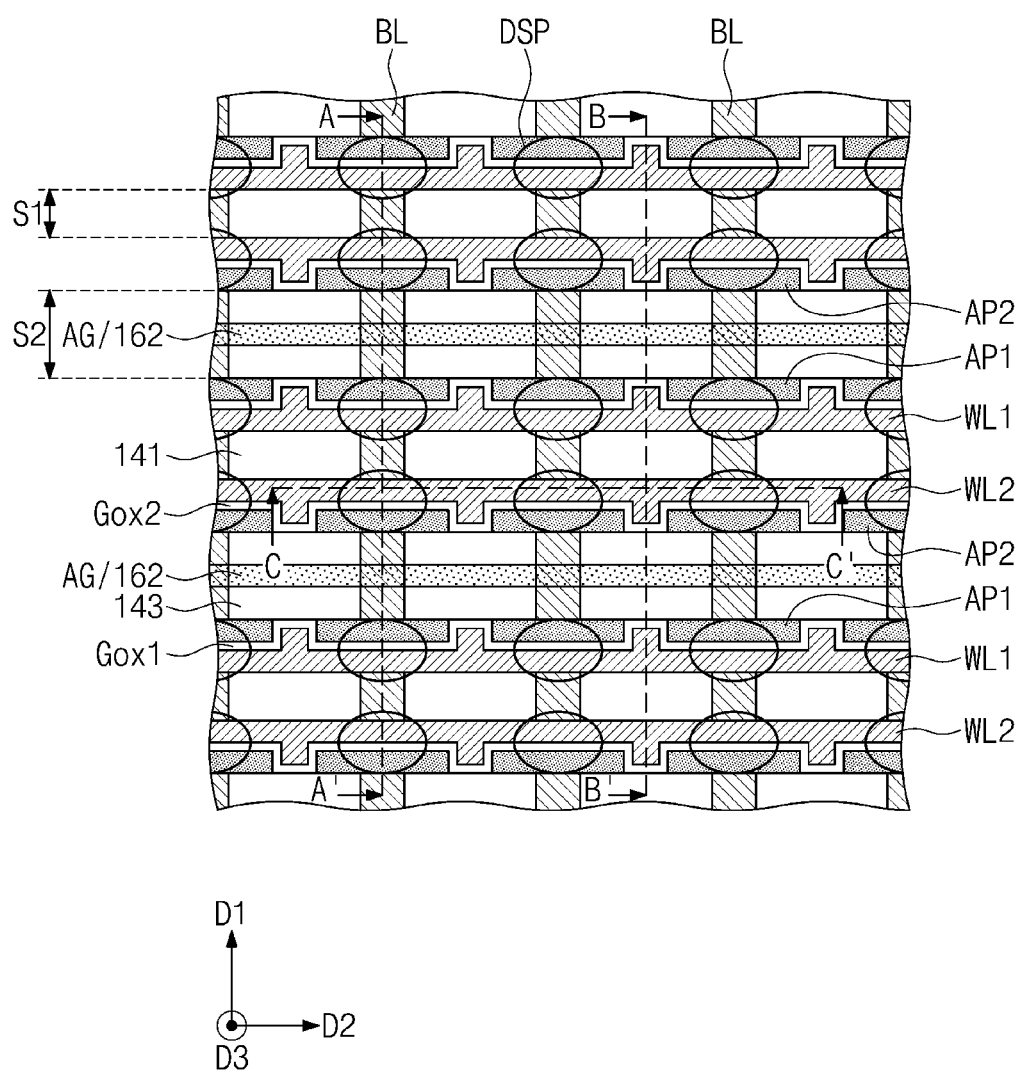
FIG. 6 is a plan view illustrating a semiconductor memory device according to an embodiment of the inventive concept.

FIG. 6 is a plan view illustrating a semiconductor memory device according to an embodiment of the inventive concept. FIGS. 7A, 7B, 7C, and 7D are sectional views, which are taken along lines A-A', B-B', and C-C' of FIG. 6 to illustrate a semiconductor memory device according to an embodiment of the inventive concept.

Figure 7A:
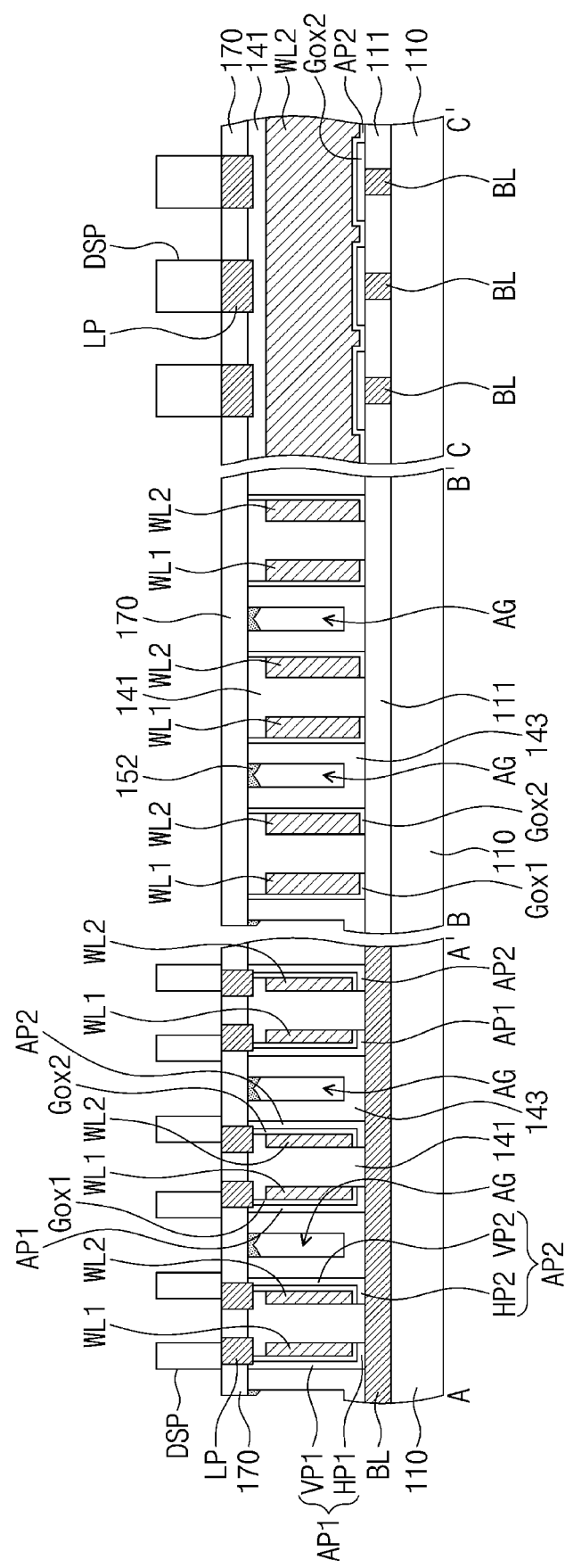
FIGS. 7A, 7B, 7C, and 7D are sectional views, which are taken along lines A-A', B-B', and C-C' of FIG. 6 to illustrate a semiconductor memory device according to an embodiment of the inventive concept.
Figure 7B:
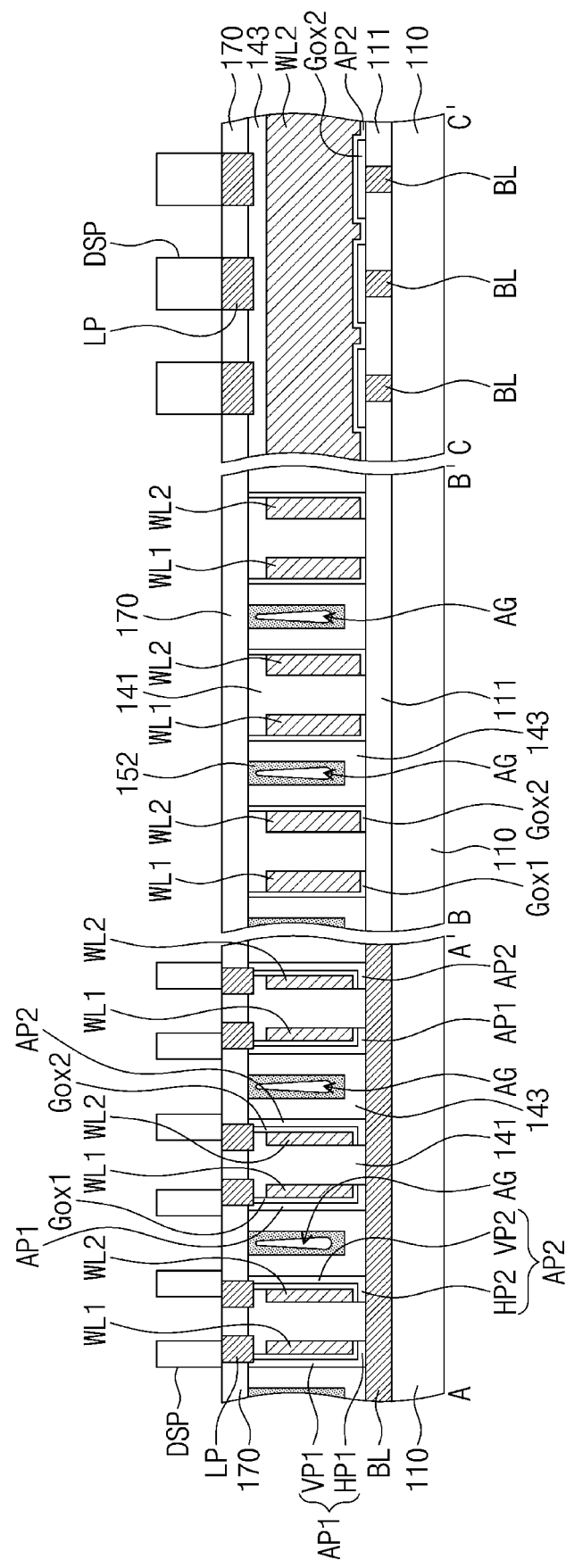
Figure 7C:
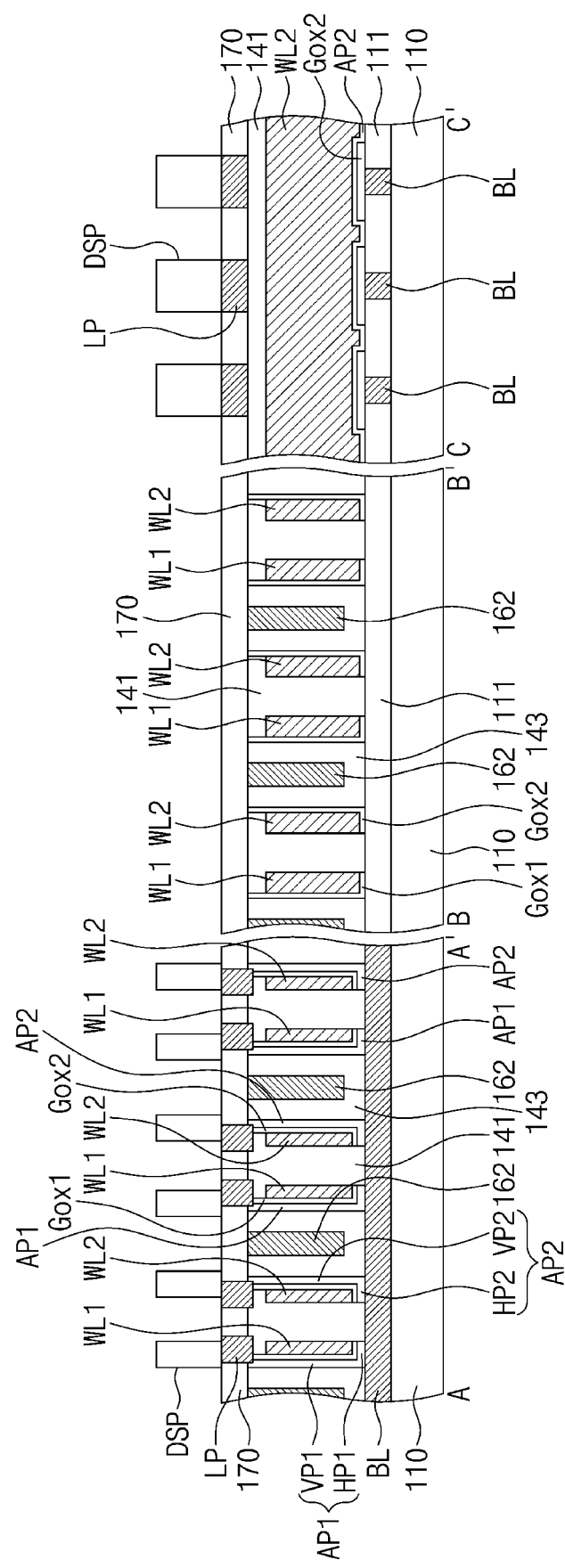
Figure 7D:
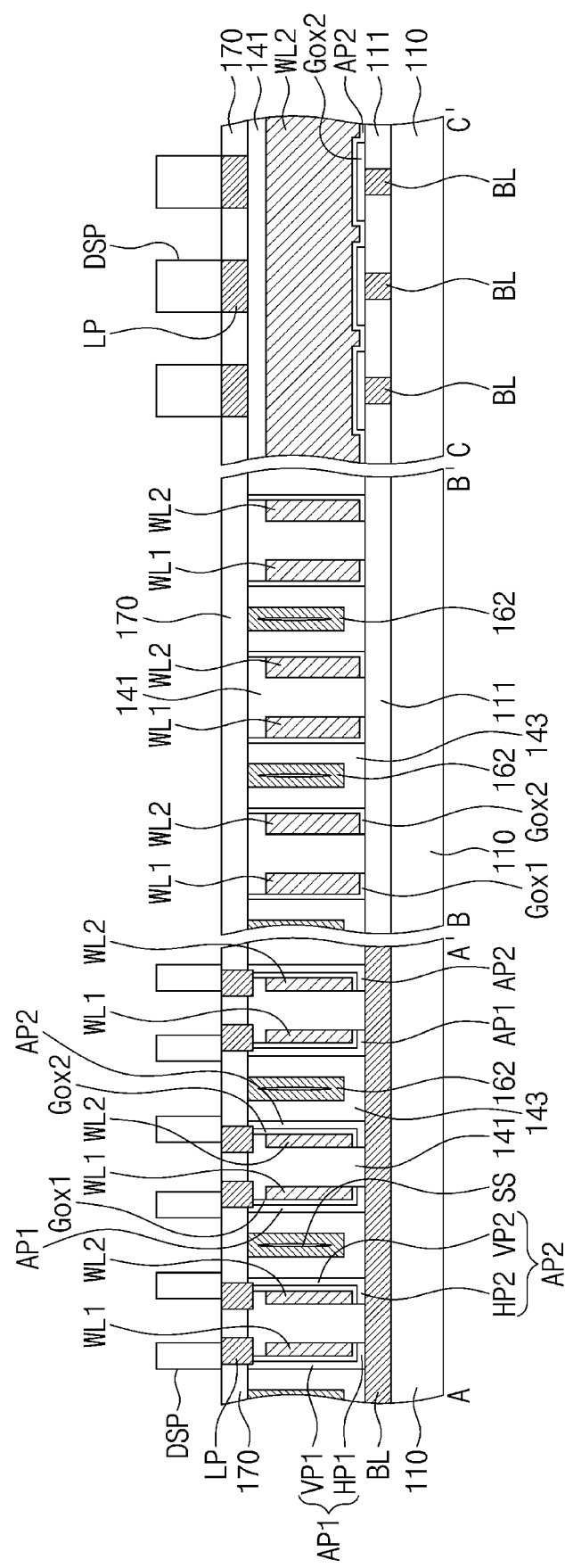

In an embodiment shown in FIGS. 6, 7A, 7B, 7C, and 7D, the semiconductor memory device may include an intermediate structure that is provided between the first and second vertical portions VP1 and VP2 of the first and second active patterns AP1 and AP2, which are adjacent to each other. An intermediate structure AG/162 may reduce a coupling noise between the first and second active patterns AP1 and AP2, which are adjacent to each other. As an example, the intermediate structure AG/162 may include an air gap AG that is provided between the first and second active patterns AP1 and AP2, as shown in FIGS. 7A and 7B. As an example, the intermediate structure AG/162 may include a shielding pattern 162 that is provided between the first and second active patterns AP1 and AP2, as shown in FIGS. 7C and 7D.

Referring to FIGS. 6 and 7A, the first and second active patterns AP1 and AP2 may be alternately arranged in the first direction D1 and on each of the bit lines BL, as described above. Furthermore, each of the first active patterns AP1 may include the first horizontal portion HP1 and the first vertical portion VP1, and each of the second active patterns AP2 may include the second horizontal portion HP2 and the second vertical portion VP2. The first and second active patterns AP1 and AP2, which are adjacent to each other, may be provided to be mirror symmetric with respect to each other. For example, the first and second active patterns AP1 and AP2 adjacent to each other may be shaped and positioned mirror symmetric with respect to each other. In some embodiment, a length, in the second direction D2, of the first active pattern AP1 may be the same as a length, in the second direction D2, of the second active pattern AP2 adjacent to the first active pattern AP1, and a width, in the first direction D1, of the first active pattern AP1 may be the same as a width, in the first direction D1, of the second active pattern AP2 adjacent to the first active pattern AP1.

The first and second word lines WL1 and WL2, which are adjacent to each other, may be spaced apart from each other by the first distance S1, and the first and second vertical portions VP1 and VP2 of the first and second active patterns AP1 and AP2, which are adjacent to each other, may be spaced apart from each other by the second distance S2. Here, the second distance S2 may be larger than the first distance S1. In some embodiment, the first and second word lines WL1 and WL2 adjacent to each other may be shaped and positioned mirror symmetric with respect to each other.

The first insulating pattern 141 may be provided between the first and second word lines WL1 and WL2, which are adjacent to each other. The first insulating pattern 141 may be in contact with the first and second word lines WL1 and WL2. In some embodiments, the first insulating pattern 141 may be disposed between a first side surface of a first word line WL1 and a first side surface of a second word line WL2. The first side surface of the first word line WL1 may be adjacent to the first side surface of the second word line WL2. The first insulating pattern 141 may contact the first side surfaces of the first and second word lines WL1 and WL2 without contacting active patterns which are disposed on second side surfaces of the first and second active patterns AP1 and AP2 which are opposite to the first side surfaces thereof, respectively. A second insulating pattern 143 may be provided between first and second active patterns AP1 and AP2, which are adjacent to each other. The second insulating pattern 143 may be in contact with the first and second vertical portions VP1 and VP2 of the first and second active patterns AP1 and AP2. The first and second insulating patterns 141 and 143 may be extended in the second direction D2. The first and second insulating patterns 141 and 143 may be formed of or include the same insulating material. In some embodiments, the first and second active patterns AP1 and AP2 may contact second side surfaces of first and second word lines WL1 and WL2. Portions of the second side surface of the first and second word lines WL1 and WL2 may protrude toward each other in the first direction D1. Each portion of the second side surface of the first word line WL1 may be disposed between a corresponding pair of first active patterns AP1 adjacent to each other in the second direction D2. Each portion of the second side surface of the second word line WL2 may be disposed between a corresponding pair of second active patterns AP2 adjacent to each other in the second direction D2.

The second insulating pattern 143 may be provided to define the air gap AG between the first and second vertical portions VP1 and VP2 of the first and second active patterns AP1 and AP2, which are adjacent to each other. A thickness of the second insulating pattern 143 on the first vertical portion VP1 of the first active pattern AP1 may be substantially equal to a thickness of the second insulating pattern 143 on the second vertical portion VP2 of the second active pattern AP2.

The second insulating pattern 143 may include a first portion, which is placed between the first vertical portion VP1 of the first active pattern AP1 and the second vertical portion VP2 of the second active pattern AP2 to cover the bit line BL, a second portion, which is vertically extended from the first portion to cover the first vertical portion VP1 of the first active pattern AP1, and a third portion, which is vertically extended from the first portion to cover the second vertical portion VP2 of the second active pattern AP2. The second and third portions of the second insulating pattern 143 may be spaced apart from each other to define a gap region therebetween.

In the embodiment of FIG. 7A, a capping pattern 152 may be provided between the uppermost ends of the second and third portions of the second insulating pattern 143. The capping pattern 152 may be vertically spaced apart from the first portion of the second insulating pattern 143. The capping pattern 152 may be extended in the second direction D2. The capping pattern 152 may be formed of an insulating material that is different from the second insulating pattern 143. As an example, the capping pattern 152 may be formed of a dielectric material whose dielectric constant is lower than the second insulating pattern 143. The present invention is not limited thereto. In an embodiment, the capping pattern 152 may be formed of or may include the same insulating material as the second insulating pattern 143.

The air gap AG may be provided between the first and second vertical portions VP1 and VP2 of the first and second active patterns AP1 and AP2, which are adjacent to each other. The air gap AG may be an empty space, which is enclosed by the second insulating pattern 143 and the capping pattern 152. The air gap AG may be extended in the second direction D2. In an embodiment, the capping pattern 152 may be omitted, and the uppermost end of the air gap AG may be defined by the interlayer insulating layer 170. The highest point of the air gap AG may be located at a level higher than the top surfaces of the first and second word lines WL1 and WL2. The term "air" as discussed herein, may refer to atmospheric air, or other gases that may be present during the manufacturing process.

In the embodiment of FIG. 7B, the capping pattern 152 may be provided in the gap region of the second insulating pattern 143, and the air gap AG may be an empty space, which is enclosed by the capping pattern 152.

The capping pattern 152 may be extended in the second direction D2. The capping pattern 152 may be formed of an insulating material that is different from the second insulating pattern 143. As an example, the capping pattern 152 may be formed of a dielectric material whose dielectric constant is lower than the second insulating pattern 143.

Referring to FIGS. 7C and 7D, the shielding pattern 162 may be provided between the first and second vertical portions VP1 and VP2 of the first and second active patterns AP1 and AP2, which are adjacent to each other. The shielding pattern 162 may be provided in the gap region of the second insulating pattern 143. The shielding pattern 162 may be extended in the second direction D2.

A top surface of the shielding pattern 162 may be located a level that is higher than top surfaces of the first and second word lines WL1 and WL2. The top surface of the shielding pattern 162 may be in contact with the interlayer insulating layer 170. For example, the top surface of the shielding pattern 162 may be substantially coplanar with the top surfaces of the first and second insulating patterns 141 and 143.

The shielding pattern 162 may be provided to completely fill the gap region of the second insulating pattern 143, as shown in FIG. 7C. Alternatively, the shielding pattern 162 may be provided to have a discontinuous interface SS (e.g., a seam or a void) therein, as shown in FIG. 7D.

The shielding pattern 162 may be formed of or may include a metallic material (e.g., tungsten (W), titanium (Ti), nickel (Ni), or cobalt (Co)). As an example, the shielding pattern 162 may be formed of or may include a two-dimensional conductive material (e.g., graphene).

Figure 8:
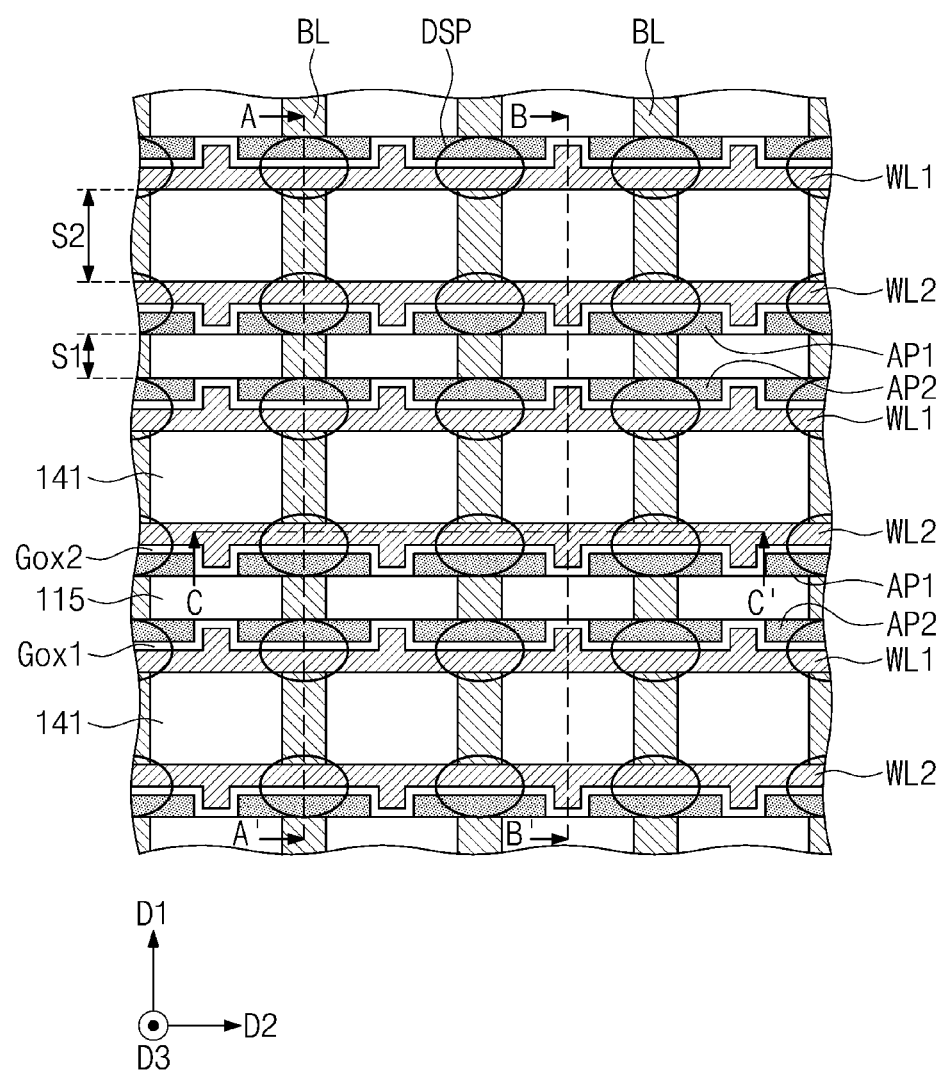
FIG. 8 is a plan view illustrating a semiconductor memory device according to an embodiment of the inventive concept.
Figure 9:
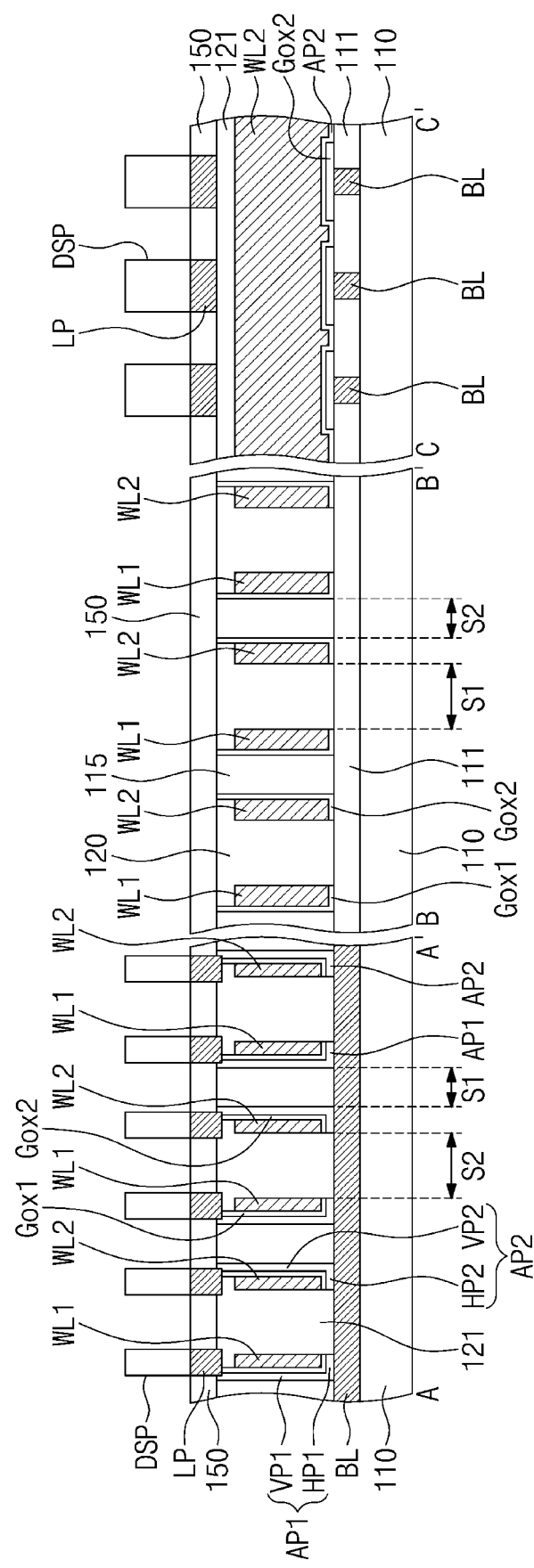
FIG. 9 is a sectional view, which is taken along lines of A-A', B-B', and C-C' of FIG. 8 to illustrate a semiconductor memory device according to an embodiment of the inventive concept.

FIG. 8 is a plan view illustrating a semiconductor memory device according to an embodiment of the inventive concept. FIG. 9 is a sectional view, which is taken along lines of A-A', B-B', and C-C' of FIG. 8 to illustrate a semiconductor memory device according to an embodiment of the inventive concept.

Referring to FIGS. 8 and 9, the first and second active patterns AP1 and AP2 may be alternately arranged in the first direction D1 on each bit line BL. In addition, each of the first active patterns AP1 may include the first horizontal portion HP1 and the first vertical portion VP1, and each of the second active patterns AP2 may include the second horizontal portion HP2 and the second vertical portion VP2. The first and second active patterns AP1 and AP2, which are adjacent to each other, may be disposed to be mirror symmetric with respect to each other. For example, the first and second active patterns AP1 and AP2 adjacent to each other may be shaped and positioned mirror symmetric with respect to each other.

As previously described with reference to FIGS. 4 and 5, the first and second word lines WL1 and WL2 may be disposed on the first and second horizontal portions HP1 and HP2 of the first and second active patterns AP1 and AP2, respectively. The first insulating pattern 141 may be provided between the first and second word lines WL1 and WL2, which are adjacent to each other, and the mold insulating pattern 115 may be provided between the first and second vertical portions VP1 and VP2 of the first and second active patterns AP1 and AP2, which are adjacent to each other.

The first and second word lines WL1 and WL2, which are adjacent to each other, may be spaced apart from each other by a second distance S2, and the first and second vertical portions VP1 and VP2 of the first and second active patterns AP1 and AP2, which are adjacent to each other, may be spaced apart from each other by a first distance S1. The second distance S2 may be greater than the first distance S1. Accordingly, it may be possible to reduce a coupling noise between the first and second word lines WL1 and WL2, which are adjacent to each other, during the operation of the vertical channel transistors.

Figure 10:
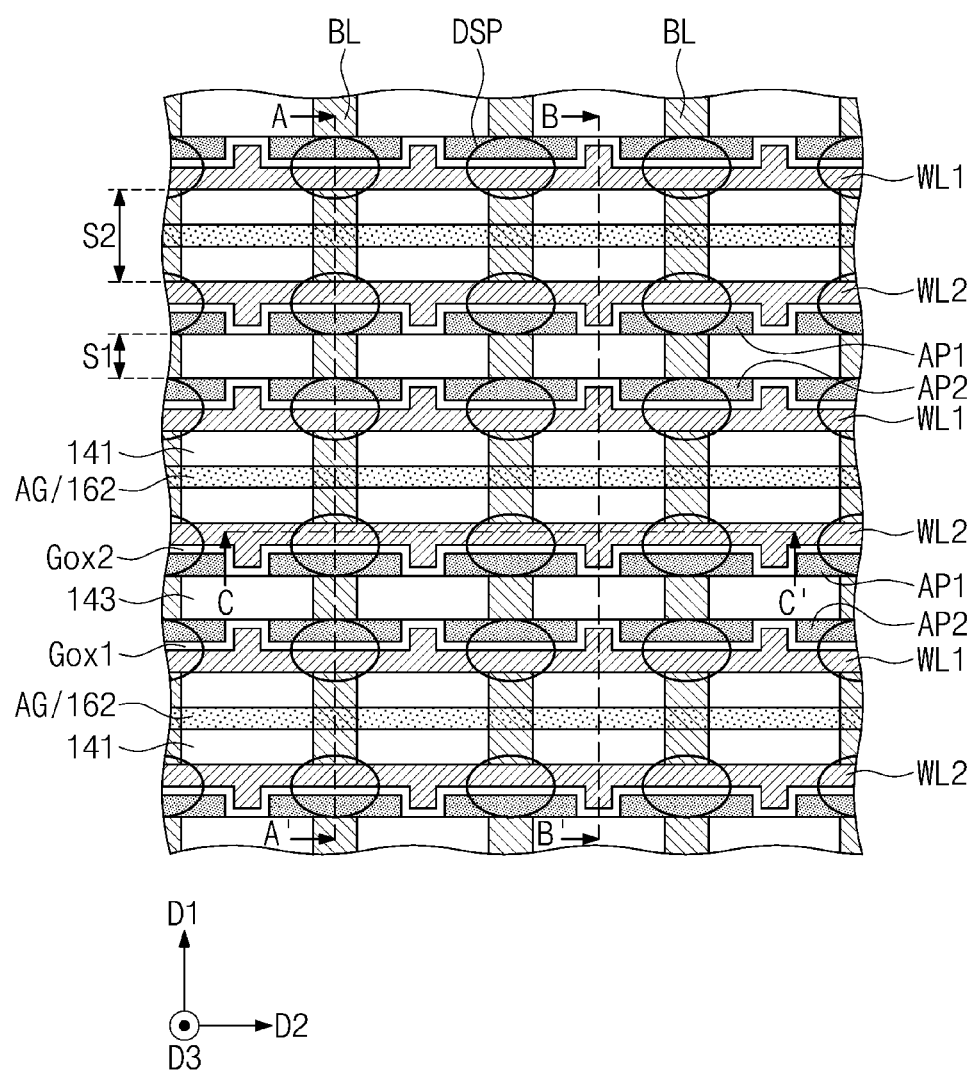
FIG. 10 is a plan view illustrating a semiconductor memory device according to an embodiment of the inventive concept.
Figure 11A:
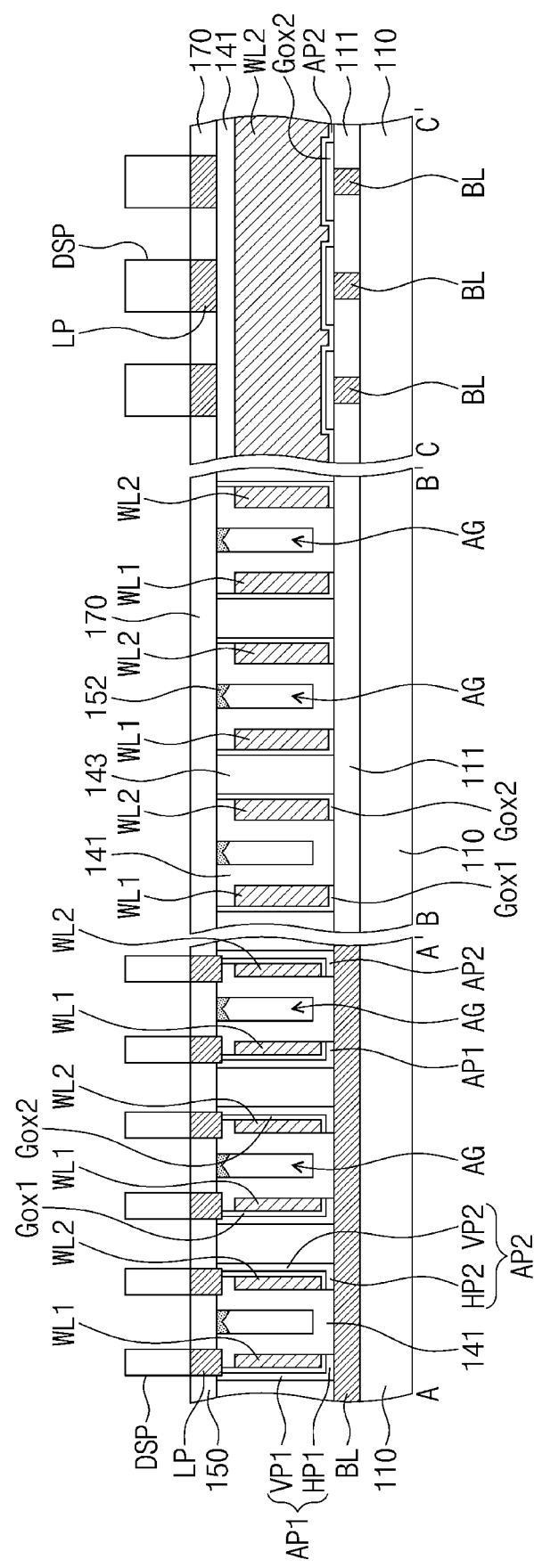
FIGS. 11A and 11B are sectional views, which are taken along lines A-A', B-B', and C-C' of FIG. 10 to illustrate a semiconductor memory device according to an embodiment of the inventive concept.
Figure 11B:
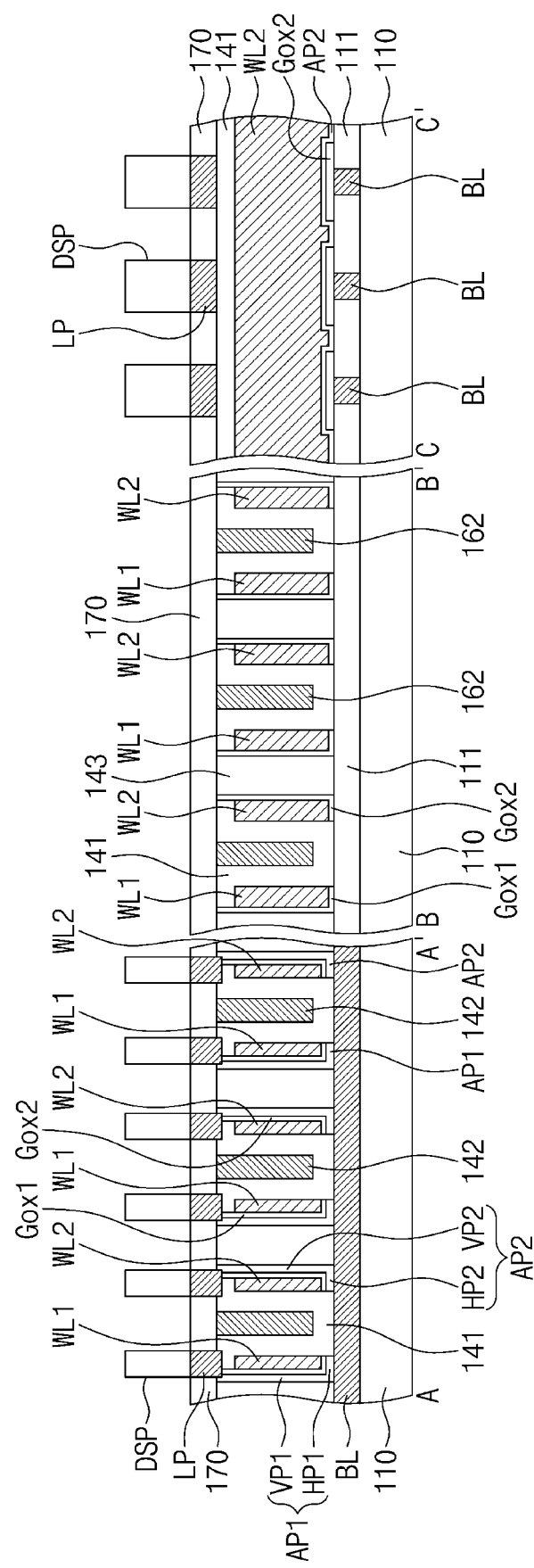

FIG. 10 is a plan view illustrating a semiconductor memory device according to an embodiment of the inventive concept. FIGS. 11A and 11B are sectional views, which are taken along lines A-A', B-B', and C-C' of FIG. 10 to illustrate a semiconductor memory device according to an embodiment of the inventive concept.

In the embodiment of FIGS. 10, 11A, and 11B, the semiconductor memory device may include the intermediate structure AG/162 provided between the first and second word lines WL1 and WL2, which are adjacent to each other. The intermediate structure AG/162 may reduce a coupling noise between the first and second word lines WL1 and WL2, which are adjacent to each other.

Referring to FIGS. 10 and 11A, the air gap AG serving as the intermediate structure may be provided between the first and second word lines WL1 and WL2, which are adjacent to each other. The air gap AG may be defined by the first insulating pattern 141 that is provided between the first and second word lines WL1 and WL2, which are adjacent to each other.

The first insulating pattern 141 may include a first portion, which is provided between the first and second word lines WL1 and WL2, which are adjacent to each other, to cover the top surface of the bit line BL, a second portion, which is vertically extended from the first portion to cover a side surface of the first word line WL1, and a third portion, which is vertically extended from the first portion to cover a side surface of the second word line WL2. A gap region may be defined between the second and third portions of the first insulating pattern 141.

The capping pattern 152 may be provided between the uppermost ends of the second and third portions of the first insulating pattern 141. The capping pattern 152 may be vertically spaced apart from the first portion of the first insulating pattern 141. The capping pattern 152 may be extended in the second direction D2. The capping pattern 152 may be formed of an insulating material that is different from the first insulating pattern 141.

The air gap AG may be an empty space that is enclosed by the first insulating pattern 141 and the capping pattern 152, which is provided between the uppermost ends of the second and third portions of the first insulating pattern 141.

In some embodiments, as described with reference to FIG. 7B, the capping pattern 152 may be provided in the gap region of the first insulating pattern 141, and the air gap AG may be an empty space that is enclosed by the capping pattern 152.

The second insulating pattern 143 may be provided between the first and second active patterns AP1 and AP2, which are adjacent to each other. The second insulating pattern 143 may be provided to completely fill a space between the first and second vertical portions VP1 and VP2 of the first and second active patterns AP1 and AP2.

The first and second insulating patterns 141 and 143 may be extended in the second direction D2. The first and second insulating patterns 141 and 143 may be formed of or may include the same insulating material.

Referring to FIGS. 10 and 11B, the shielding pattern 162 serving as the intermediate structure may be provided between the first and second word lines WL1 and WL2, which are adjacent to each other.

The shielding pattern 162 may be provided in the gap region of the first insulating pattern 141 and may be extended in the second direction D2. The shielding pattern 162 may completely fill the gap region of the first insulating pattern 141 and may be formed of a conductive material. The shielding pattern 162 may be provided to have a discontinuous interface therein, as described with reference to FIG. 7D.

Figure 12:
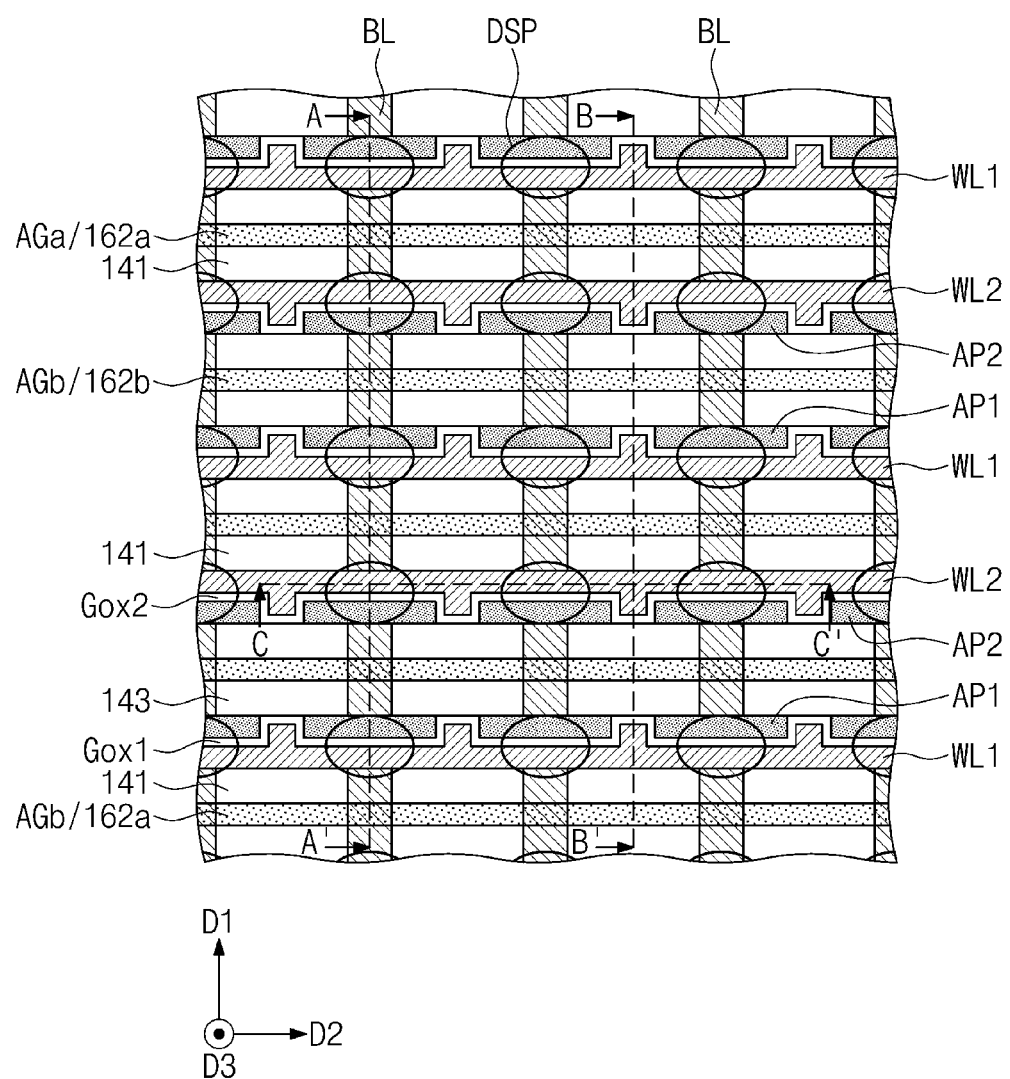
FIG. 12 is a plan view illustrating a semiconductor memory device according to an embodiment of the inventive concept.
Figure 13A:
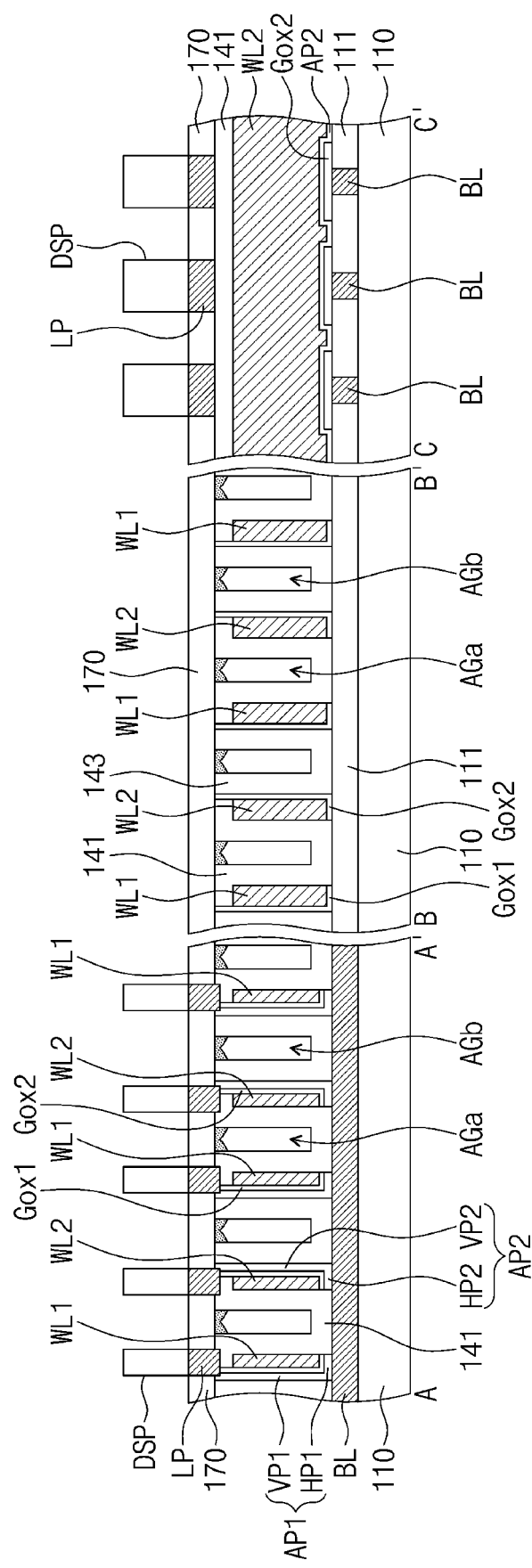
FIGS. 13A and 13B are sectional views, which are taken along lines A-A', B-B', and C-C' of FIG. 12 to illustrate a semiconductor memory device according to an embodiment of the inventive concept.
Figure 13B:
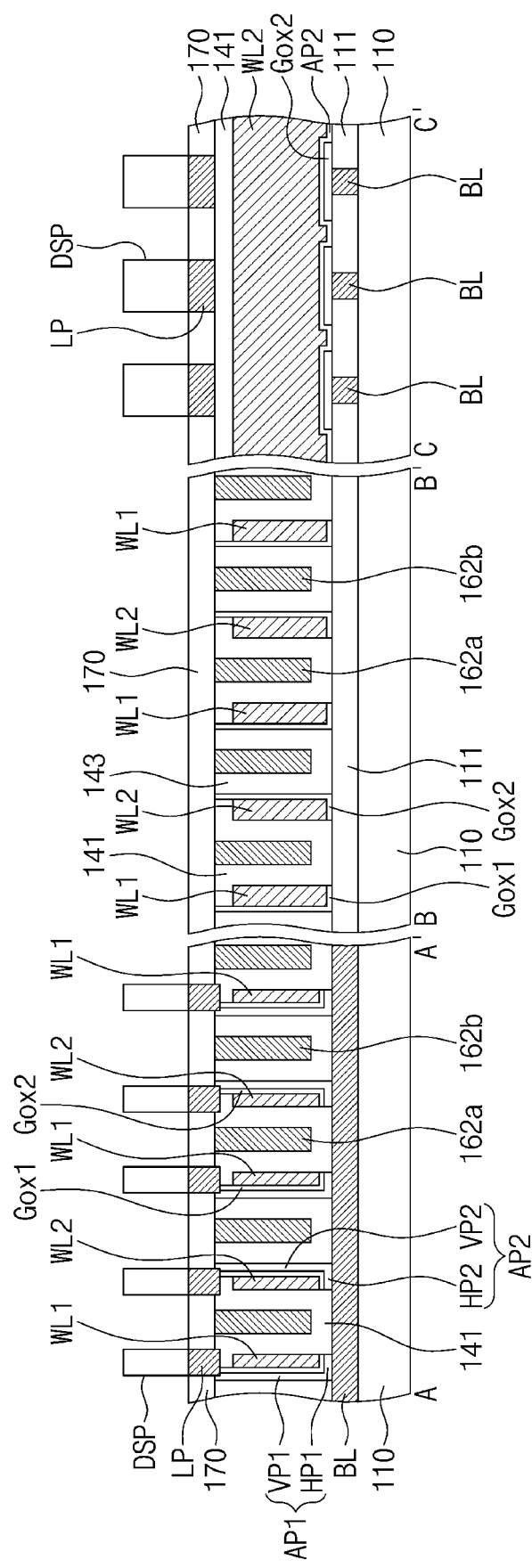

FIG. 12 is a plan view illustrating a semiconductor memory device according to an embodiment of the inventive concept. FIGS. 13A and 13B are sectional views, which are taken along lines A-A', B-B', and C-C' of FIG. 12 to illustrate a semiconductor memory device according to an embodiment of the inventive concept.

In the embodiment of FIGS. 12, 13A, and 13, the semiconductor memory device may include a first intermediate structure AGa/162a provided between the first and second word lines WL1 and WL2, which are adjacent to each other, and a second intermediate structure AGb/162b provided between the first and second vertical portions VP1 and VP2 of the first and second active patterns AP1 and AP2, which are adjacent to each other. The first and second intermediate structures AGa/162a and AGb/162b may include an air gap or a shielding pattern, as described above.

Referring to FIGS. 12 and 13A, the first insulating pattern 141 may be disposed between the first and second word lines WL1 and WL2, which are adjacent to each other, and the second insulating pattern 143 may be provided between the first and second vertical portions VP1 and VP2 of the first and second active patterns AP1 and AP2, which are adjacent to each other.

Each of the first and second insulating patterns 141 and 143 may include a first portion, which is disposed to cover the top surface of the bit line BL, and second and third portions, which are vertically extended from the first portion and are spaced apart from each other.

The capping patterns 152 may be disposed between the second and third portions of the first insulating pattern 141 and between the second and third portions of the second insulating pattern 143.

The first air gap AGa may be provided in the first insulating pattern 141, and the second air gap AGb may be provided in the second insulating pattern 143. The first air gap AGa may be an empty space, which is enclosed by the second and third portions of the first insulating pattern 141 and the capping pattern 152. The second air gap AGb may be an empty space, which is enclosed by the second and third portions of the second insulating pattern 143 and the capping pattern 152.

As an example, the capping pattern 152 may be omitted, and the uppermost ends of the first and second air gaps AGa and AGb may be defined by the interlayer insulating layer 170.

Referring to FIGS. 12 and 13B, a first shielding pattern 162a may be provided to fill the gap region of the first insulating pattern 141, and a second shielding pattern 162b may be provided to fill the gap region of the second insulating pattern 143.

Top surfaces of the first and second shielding patterns 162a and 162b may be in contact with the interlayer insulating layer 170. The first and second shielding patterns 162a and 162b may be disposed to have substantially the same features as the shielding pattern 162 described with reference to FIGS. 7C and 7D.

Figure 14:
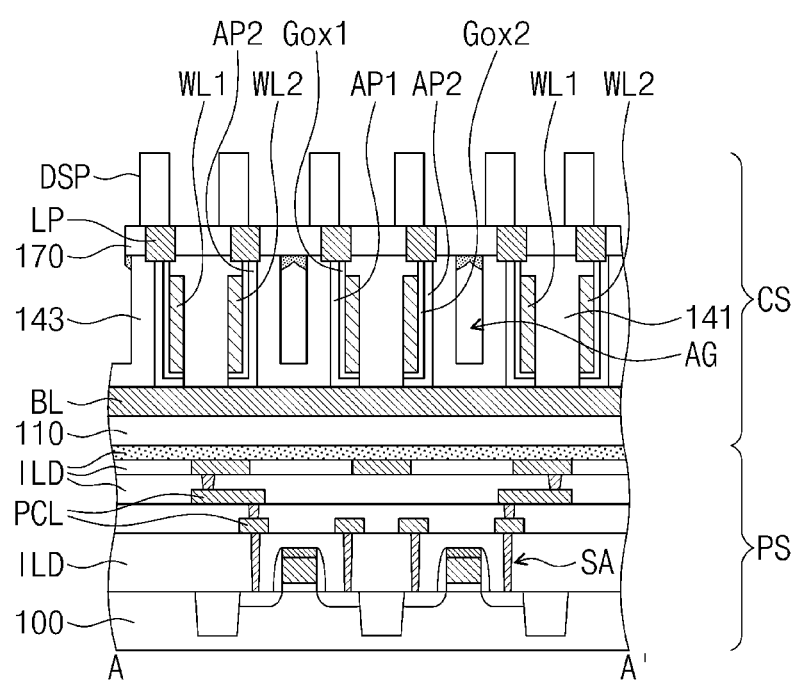
FIGS. 14 and 15 are sectional views, which are taken along the line A-A' of FIG. 6 to illustrate a semiconductor memory device according to an embodiment of the inventive concept.
Figure 15:
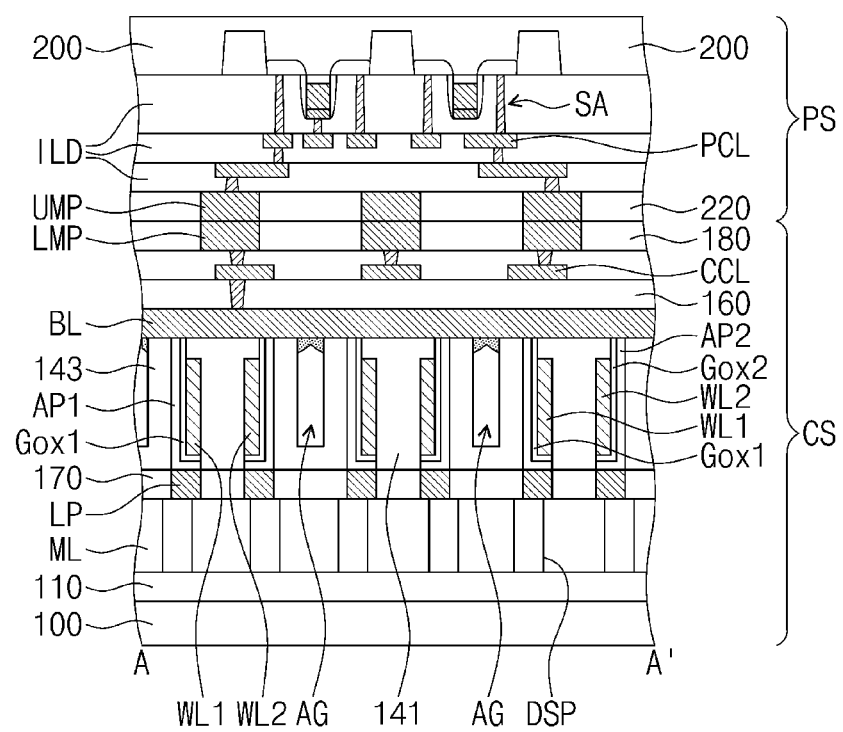

FIGS. 14 and 15 are sectional views, which are taken along the line A-A' of FIG. 6 to illustrate a semiconductor memory device according to an embodiment of the inventive concept.

According to the embodiment shown in FIG. 14, the semiconductor memory device may include the peripheral circuit structure PS on the semiconductor substrate 100 and the cell array structure CS on the peripheral circuit structure PS. The semiconductor substrate 100 may be, for example, a single crystalline silicon substrate.

The peripheral circuit structure PS may be disposed between the semiconductor substrate 100 and the lower insulating layer 110. The peripheral circuit structure PS may include the core and peripheral circuits SA formed on the semiconductor substrate 100, peripheral circuit insulating layers ILD, which are stacked between the semiconductor substrate 100 and the lower insulating layer 110 to cover the core and peripheral circuits SA, and peripheral metal structures PCL, which are disposed in the peripheral circuit insulating layers ILD.

The core and peripheral circuits SA may include the row and column decoders 2 and 4, the sense amplifier 3, and the control logic 5 described with reference to FIG. 1. As an example, the core and peripheral circuits SA may include NMOS and PMOS transistors integrated on the semiconductor substrate 100.

The peripheral metal structures PCL may include at least two metal patterns and metal plugs, which are provided to connect the metal patterns to each other.

The core and peripheral circuits SA may be electrically connected to the bit lines BL through the peripheral metal structures PCL. For example, the sense amplifiers may be electrically connected to the bit lines BL, and each of the sense amplifiers may amplify and output a difference in voltage level between signals transferred by a pair of the bit lines BL from the memory cells MC of the memory cell array 1 of FIG. 1.

The peripheral circuit insulating layers ILD may be provided on the semiconductor substrate 100 to cover the core and peripheral circuits SA and the peripheral metal structures PCL. The peripheral circuit insulating layers ILD may include a plurality of vertically-stacked insulating layers. The peripheral circuit insulating layers ILD may include or may be formed of at least one of, for example, a silicon oxide layer, a silicon nitride layer, a silicon oxynitride layer, and a low-k dielectric layer.

The cell array structure CS may include memory cells including vertical channel transistors (VCTs), similar to that in the previous embodiment. The vertical channel transistor may refer to a transistor whose channel region is elongated in a direction perpendicular to a top surface of the semiconductor substrate 100. The cell array structure CS may include the bit lines BL, the first and second active patterns AP1 and AP2, the first and second word lines WL1 and WL2, the first and second gate insulating patterns Gox1 and Gox2, and the data storage patterns DSP. The bit lines BL of the cell array structure CS may be disposed adjacent to the peripheral circuit structure PS. Since the bit lines BL are disposed adjacent to the peripheral circuit structure PS, a length of an electric connection path between the bit lines BL and the core and peripheral circuits SA may be reduced.

The cell array structure CS may include the air gaps AG or the shielding patterns 162, as described above. The cell array structure CS may include substantially the same element as the semiconductor memory device described with reference to FIGS. 4 to 13B, and thus, for concise description, such an element may be identified by the same reference number without repeating an overlapping description thereof.

In the embodiment of FIG. 15, the semiconductor memory device may include the cell array structure CS, which includes the lower metal pads LMP as its topmost elements, and the peripheral circuit structure PS, which includes the upper metal pads UMP as its topmost elements. The lower metal pads LMP of the cell array structure CS may be electrically and physically connected to the upper metal pads UMP of the peripheral circuit structure PS, respectively, in a bonding manner. The lower and upper metal pads LMP and UMP may be formed of or include at least one of metallic materials (e.g., copper (Cu)).

The cell array structure CS may include the data storage patterns DSP, the first and second word lines WL1 and WL2, which are provided on the data storage patterns DSP, are extended in the second direction D2, and are alternately arranged in the first direction D1, the bit lines BL, which are provided on the first and second word lines WL1 and WL2, are extended in the first direction D1, and are spaced apart from each other in the second direction D2, and the lower metal pads LMP, which are electrically connected to the bit lines BL.

The data storage patterns DSP may be disposed on the lower insulating layer 110 covering the first semiconductor substrate 100. Each of the data storage patterns DSP may be a capacitor, which is provided in a mold layer ML and includes a bottom electrode, a top electrode, and a dielectric layer therebetween.

The landing pads LP may be disposed on the data storage patterns DSP, respectively, and the interlayer insulating layer 170 may be provided to fill spaces between the landing pads LP.

The first and second active patterns AP1 and AP2 may be disposed on the landing pads LP, respectively, and each of the first and second active patterns AP1 and AP2 may include a horizontal portion and a vertical portion, which is vertically extended from the horizontal portion, as described above. The horizontal portions of the first and second active patterns AP1 and AP2 may be in contact with the top surfaces of the landing pads LP.

The first and second active patterns AP1 and AP2 may be spaced apart from each other in both of the first and second directions D1 and D2, and the first and second active patterns AP1 and AP2, which are adjacent to each other, may be disposed to be mirror symmetric with respect to each other in the first direction D1.

The first and second word lines WL1 and WL2 may be disposed on the horizontal portions of the first and second active patterns AP1 and AP2, respectively. The first and second word lines WL1 and WL2 may be extended in the second direction D2 and may be spaced apart from each other in the first direction D1, as described above.

As described above, the air gap AG may be provided between the vertical portions of the first and second active patterns AP1 and AP2, which are adjacent to each other. Alternatively, the shielding pattern 162 may be provided between the vertical portions of the first and second active patterns AP1 and AP2, which are adjacent to each other. For example, the cell array structure CS may include substantially the same element as the semiconductor memory device described with reference to FIGS. 4 to 13B, and thus, for concise description, such an element may be identified by the same reference number without repeating an overlapping description thereof.

Each of the bit lines BL may be in contact with top surfaces of the vertical portions of the first and second active patterns AP1 and AP2, which are arranged in the first direction D1. The bit lines BL may be electrically connected to the lower metal pads LMP through cell metal structures CCL. The lower metal pads LMP may be disposed in the uppermost insulating layer 180 of the cell array structure CS.

The peripheral circuit structure PS may include the core and peripheral circuits SA, which are integrated on the second semiconductor substrate 200, peripheral contact plugs PCT and peripheral metal structures PCL, which are electrically connected to the core and peripheral circuits SA, and the upper metal pads UMP, which are electrically connected to the peripheral metal structures PCL. The upper metal pads UMP may be disposed in the topmost insulating layer 220 of the peripheral circuit structure PS.

The lower and upper metal pads LMP and UMP may have substantially the same size and arrangement. The lower and upper metal pads LMP and UMP may be formed of or may include at least one of, for example, copper (Cu), aluminum (Al), nickel (Ni), cobalt (Co), tungsten (W), titanium (Ti), tin (Sn), or alloys thereof.

The semiconductor memory device may be fabricated by forming the cell array structure CS including the memory cells on the first semiconductor substrate 100, forming the peripheral circuit structure PS including the core and peripheral circuits on the second semiconductor substrate 200 that is distinct from the first semiconductor substrate 100, and then connecting the first semiconductor substrate 100 to the second semiconductor substrate 200 in the bonding manner. For example, the lower metal pads LMP of the cell array structure CS may be electrically and physically connected to the upper metal pads UMP of the peripheral circuit structure PS, respectively, in a bonding manner. In some embodiments, the lower metal pads LMP may be in contact with the upper metal pads UMP.

FIGS. 16 to 22 are sectional views, which are taken along lines the A-A', B-B', and C-C' of FIG. 6 to illustrate a method of fabricating a semiconductor memory device according to an embodiment of the inventive concept.

Figure 23A:
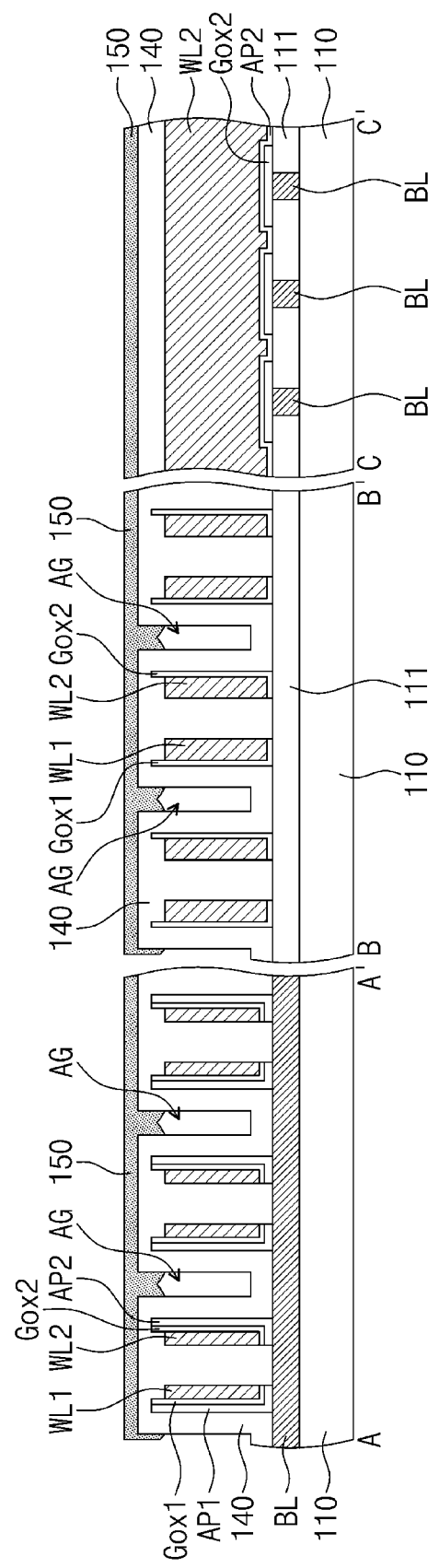
FIGS. 23A, 23B, and 23C are sectional views illustrating a method of forming an intermediate structure of a semiconductor memory device, according to an embodiment of the inventive concept.
Figure 23B:
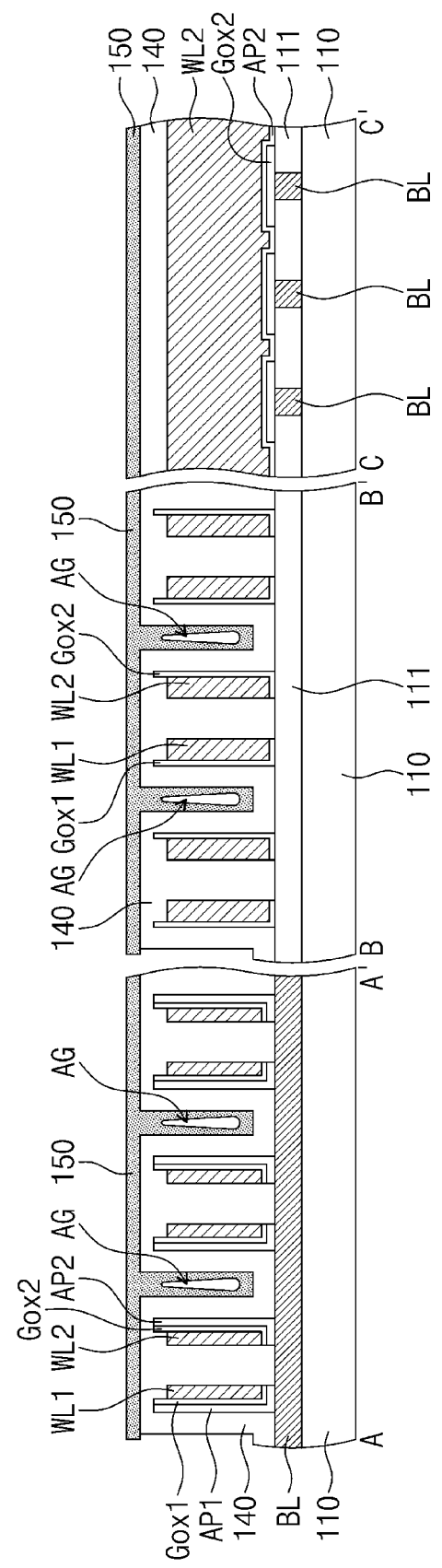
Figure 23C:
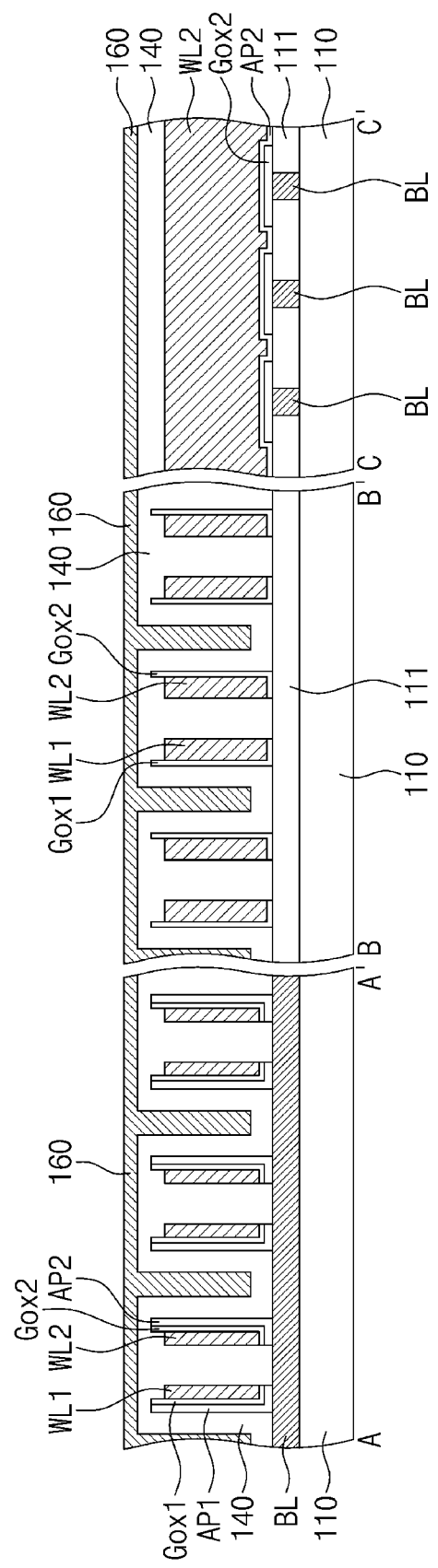

FIGS. 23A, 23B, and 23C are sectional views illustrating a method of forming an intermediate structure of a semiconductor memory device, according to an embodiment of the inventive concept.

Figure 16:
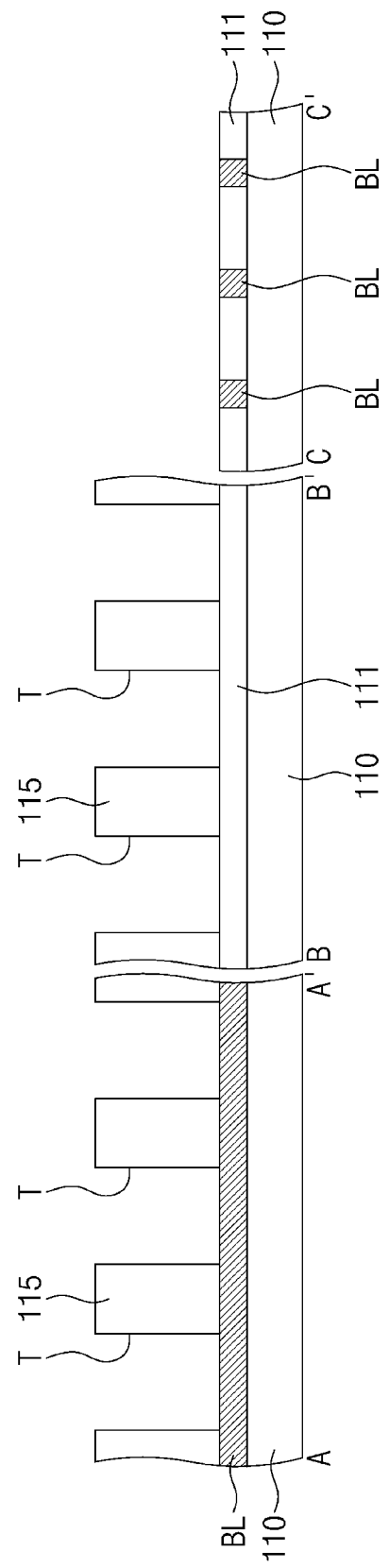
FIGS. 16 to 22 are sectional views, which are taken along lines A-A', B-B', and C-C' of FIG. 6 to illustrate a method of fabricating a semiconductor memory device according to an embodiment of the inventive concept.

Referring to FIGS. 6 and 16, the bit lines BL extending in the first direction D1 may be formed on the lower insulating layer 110.

The lower insulating layer 110 may be formed to cover a semiconductor substrate (not shown) and may include a plurality of insulating layers that are vertically stacked. For example, the lower insulating layer 110 may include or may be formed of at least one of a silicon oxide layer, a silicon nitride layer, a silicon oxynitride layer, and a low-k dielectric layer.

The bit lines BL may be formed by depositing a conductive layer on the lower insulating layer 110 and patterning the conductive layer. Spaces between the bit lines BL may be filled with an insulating gapfill pattern 111, and the insulating gapfill pattern 111 may be formed to have a top surface that is substantially coplanar with the top surfaces of the bit lines BL. Alternatively, the bit lines BL may be formed by forming trenches in the insulating gapfill pattern 111 and then filling the trenches with a conductive material.

The mold insulating pattern 115 may be formed on the lower insulating layer 110. The mold insulating pattern 115 may be extended in the second direction D2 to define trenches T which are spaced apart from each other in the first direction D1. The trenches T may be formed to expose portions of the bit lines BL.

According to an embodiment of the inventive concept, the distances between active patterns may depend on the width of the mold insulating pattern 115 (i.e., a distance between the trenches T). The distances between the word lines, which will be formed in a subsequent step, may depend on the widths of the trenches T.

The mold insulating pattern 115 may be formed of an insulating material having etch selectivity with respect to the lower insulating layer 110. For example, the mold insulating pattern 115 may be formed of or may include at least one of silicon oxide, silicon nitride, silicon oxynitride, and low-k dielectric materials.

Figure 17:
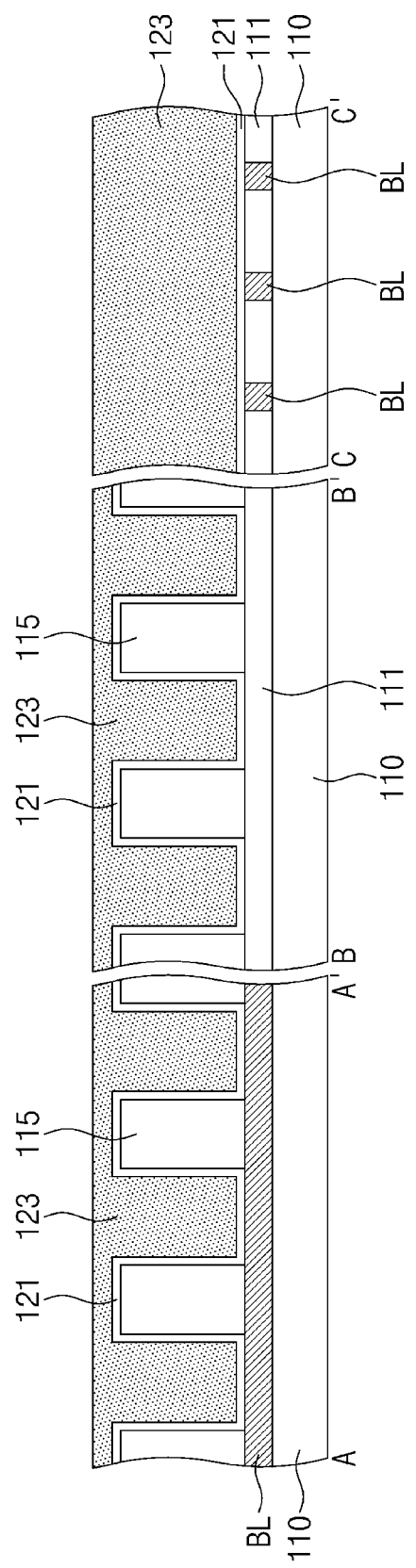

Referring to FIGS. 6 and 17, an active layer 121 may be formed to conformally cover the mold insulating pattern 115 having the trenches. The active layer 121 may be in contact with the bit lines BL in the trenches T, and may cover the top and side surfaces of the mold insulating pattern 115.

The active layer 121 may be formed using at least one of physical vapor deposition (PVD), thermal chemical vapor deposition (thermal CVD), low-pressure chemical vapor deposition (LP-CVD), plasma-enhanced chemical vapor deposition (PE-CVD), and atomic layer deposition (ALD) technologies. The active layer 121 may be formed to cover the bottom and inner side surfaces of the trenches T with a substantially constant thickness. The thickness of the active layer 121 may be smaller than half the width of the trench. The active layer 121 may be deposited to have a thickness of from several nanometers to several tens of nanometers (in particular, from 1 nm to 30 nm or in more particular, from 1 nm to 10 nm). The active layer 121 may be formed of or may include at least one of semiconductor materials, oxide semiconductor materials, and two-dimensional semiconductor materials. In an embodiment, the active layer 121 may be formed of or may include at least one of silicon, germanium, silicon-germanium, and indium gallium zinc oxide (IGZO).

A sacrificial layer 123 may be formed on the active layer 121 to fill the trenches T. The sacrificial layer 123 may have a substantially flat top surface. The sacrificial layer 123 may be formed of an insulating material that has etch selectivity with respect to the mold insulating pattern 115. As an example, the sacrificial layer 123 may be one of insulating layers, which are formed using a spin-on-glass (SOG) technique, and a silicon oxide layer Next, the sacrificial layer 123 and the active layer 121 may be planarized to expose the top surface of the mold insulating pattern 115.

Figure 18:
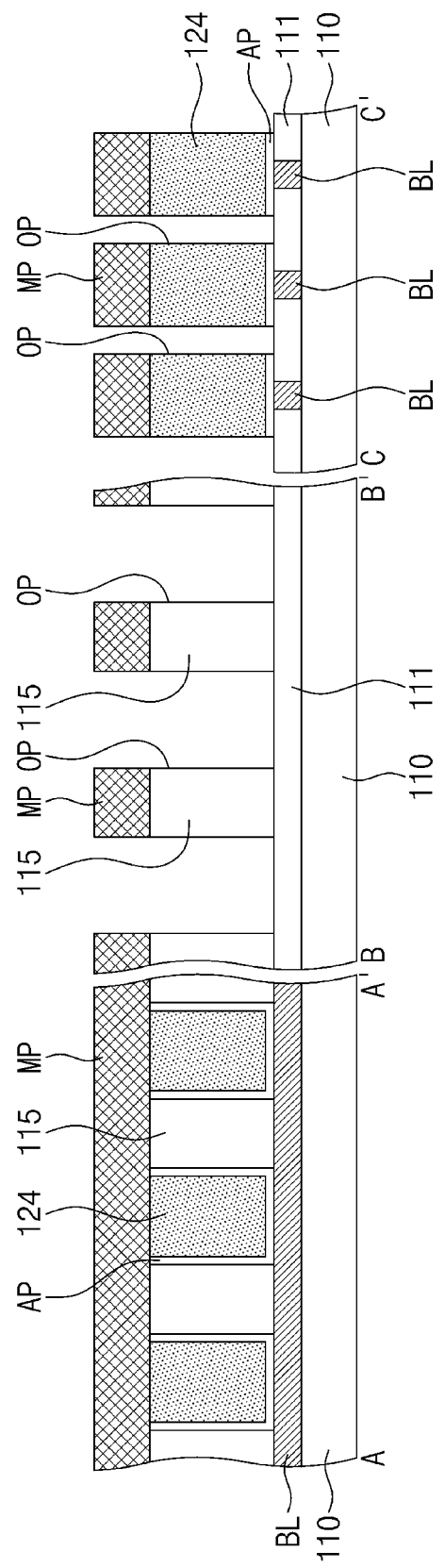

Thereafter, referring to FIGS. 6 and 18, after the planarization process, a mask pattern MP may be formed on the planarized sacrificial and active layers 123 and 121.

The mask pattern MP may be formed on the mold insulating pattern 115 to have openings that are elongated in the first direction D1. The openings of the mask pattern MP may be spaced apart from each other in the second direction D2. The openings of the mask pattern MP may be located between the bit lines BL, when viewed in a plan view. The mask pattern MP may be formed to expose portions of the top surfaces of the planarized sacrificial and active layers 123 and 121.

Next, the sacrificial layer 123 and the active layer 121 may be sequentially etched using the mask pattern MP as an etch mask to form openings OP which expose the insulating gapfill pattern 111 between the bit lines BL.

Accordingly, preliminary active patterns AP and sacrificial patterns 124 may be formed in each of the trenches and on the preliminary active patterns AP. The preliminary active patterns AP and the sacrificial patterns 124 in each of the trenches may be spaced apart from each other in the second direction D2.

Each of the preliminary active patterns AP may include a horizontal portion, which is in contact with the bit line BL, and a pair of vertical portions, which are vertically extended from the horizontal portion and are in contact with side surfaces of each trench.

After the formation of the preliminary active patterns AP, an ashing process may be performed to remove the mask pattern MP.

Figure 19:
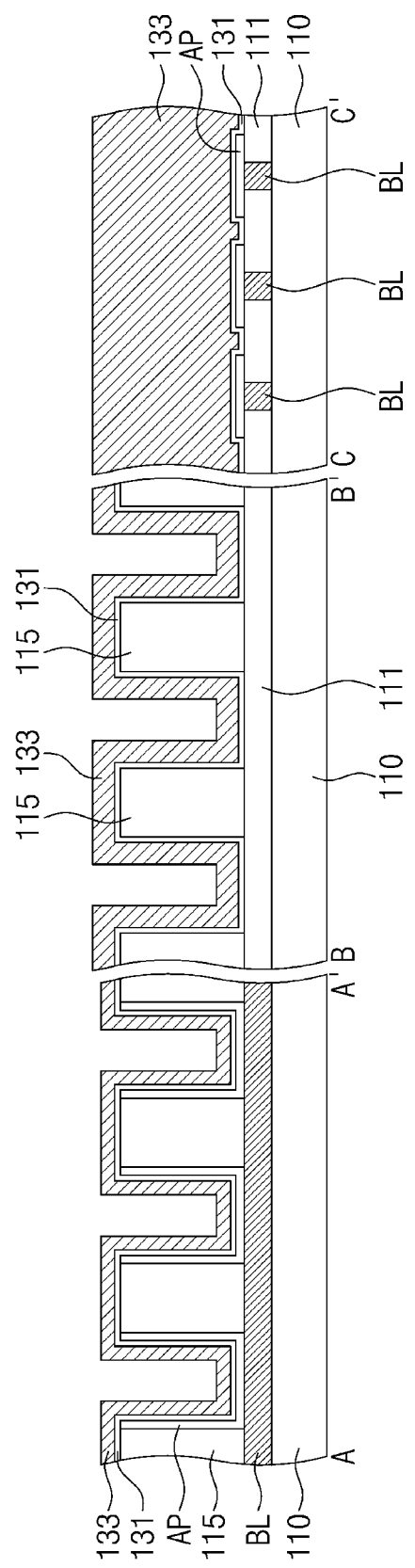

Next, referring to FIGS. 6 and 19, the sacrificial patterns 124 may be selectively removed using an etch recipe having etch selectivity with respect to the mold insulating pattern 115 and the preliminary active patterns AP. Accordingly, surfaces of the preliminary active patterns AP, which are spaced apart from each other in the second direction D2, may be exposed through each trench.

Thereafter, a gate insulating layer 131 and a gate conductive layer 133 may be sequentially deposited to conformally cover the preliminary active patterns AP. The gate insulating layer 131 and the gate conductive layer 133 may be formed using at least one of physical vapor deposition (PVD), thermal chemical vapor deposition (thermal CVD), low pressure chemical vapor deposition (LP-CVD), plasma-enhanced chemical vapor deposition (PE-CVD), and atomic layer deposition (ALD) technologies.

The gate insulating layer 131 and the gate conductive layer 133 may cover the horizontal and vertical portions of the preliminary active patterns AP with a substantially constant thickness. A sum of thicknesses of the gate insulating layer 131 and the gate conductive layer 133 may be smaller than half of the width of the trench. Accordingly, the gate conductive layer 133 may be deposited on the gate insulating layer 131 to define a gap region in the trench.

Between the preliminary active patterns AP, the gate insulating layer 131 may be in contact with the top surface of the insulating gapfill pattern 111 and the side surfaces of the mold insulating pattern 115.

Figure 20:
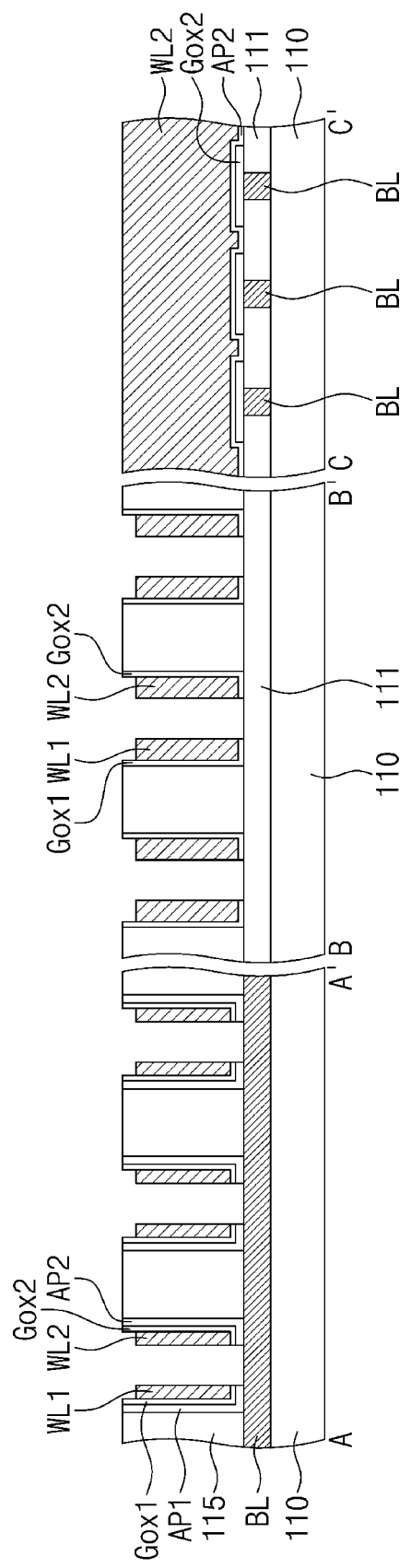

Referring to FIGS. 6 and 20, an anisotropic etching process on the gate conductive layer 133 may be performed to form a pair of the first and second word lines WL1 and WL2, which are spaced apart from each other in each trench. As a result of the anisotropic etching process on the gate conductive layer 133, the first and second word lines WL1 and WL2 may have top surfaces that are lower than the top surfaces of the preliminary active patterns AP. Alternatively, an additional etching process may be performed to recess the top surfaces of the first and second word lines WL1 and WL2.

Thereafter, an anisotropic etching process may be performed to sequentially etch the gate insulating layer 131 and the preliminary active patterns AP, which are located between the first and second word lines WL1 and WL2. Accordingly, a pair of the first and second active patterns AP1 and AP2, which are spaced apart from each other, and a pair of the first and second gate insulating patterns Gox1 and Gox2, which are spaced apart from each other, may be formed in each trench. The bit lines BL may be partially exposed through each trench.

As described above, each of the first and second active patterns AP1 and AP2 may include a horizontal portion, which is in contact with the bit line BL, and a vertical portion, which is vertically extended from the horizontal portion. Side surfaces of the horizontal portions of the first and second active patterns AP1 and AP2 may be vertically aligned to side surfaces of the first and second word lines WL1 and WL2.

In an embodiment, after the formation of the first and second active patterns AP1 and AP2, spaces between the first and second word lines WL1 and WL2 may be filled with the first insulating pattern 141, as described with reference to FIGS. 4 and 5.

The formation of the first insulating pattern 141 may include depositing an insulating layer to fully fill the trenches provided with the first and second word lines WL1 and WL2 and then performing a planarization process to expose the top surfaces of the first and second active patterns AP1 and AP2. The first insulating pattern 141 may be formed of or may include at least one of, for example, silicon oxide, silicon nitride, silicon oxynitride, and low-k dielectric materials.

After the formation of the first and second active patterns AP1 and AP2, a process of forming the intermediate structure between the first and second word lines WL1 and WL2 and/or between the vertical portions of the first and second active patterns AP1 and AP2 may be performed, instead of forming the first insulating pattern 141 between the first and second word lines WL1 and WL2.

Figure 21:
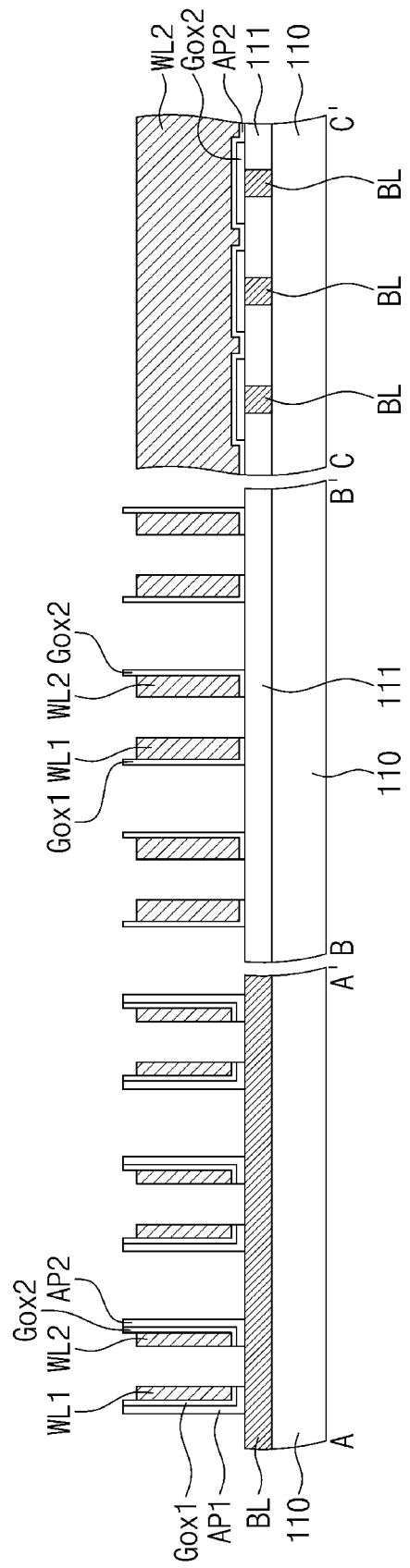

Referring to FIGS. 6 and 21, a process of removing the mold insulating pattern 115 may be performed after the formation of the first and second active patterns AP1 and AP2. Accordingly, the top surfaces of the bit lines BL between the first and second word lines WL1 and WL2 and between the first and second active patterns AP1 and AP2 may be exposed to the outside. As a result of the removal of the mold insulating pattern 115, the vertical portions of the first and second active patterns AP1 and AP2 may also be exposed to the outside.

Figure 22:
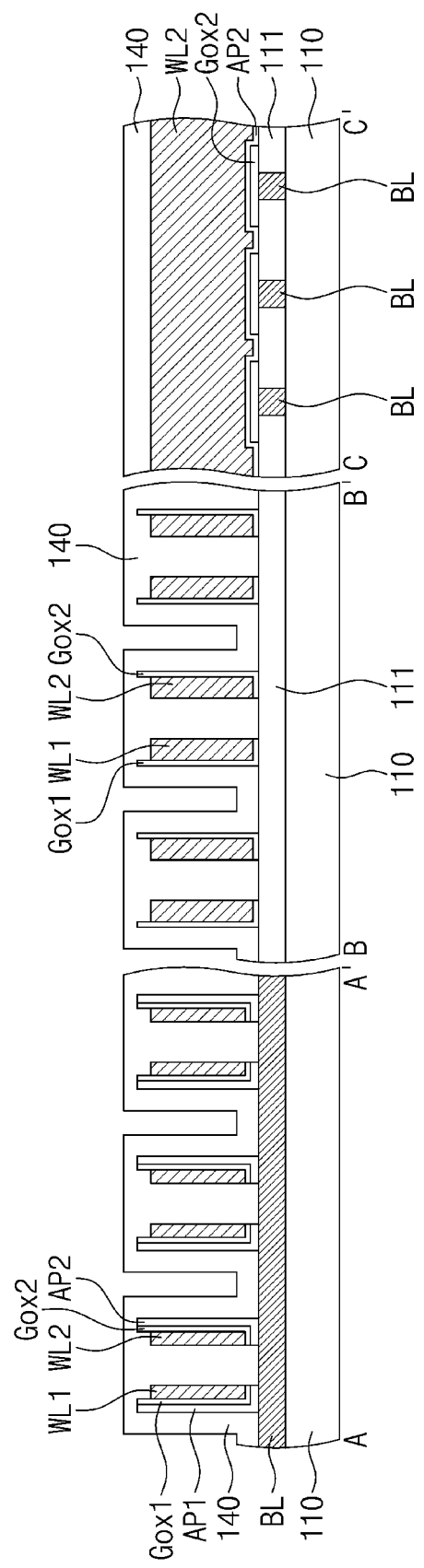

Referring to FIGS. 6 and 22, a first insulating layer 140 may be formed to define a gap region between the vertical portions of the first and second active patterns AP1 and AP2.

The first insulating layer 140 may be conformally deposited on the vertical portions of the first and second active patterns AP1 and AP2 and the bit lines BL to fill spaces between the first and second word lines WL1 and WL2. A deposition thickness of the first insulating layer 140 may be smaller than half of the distance between the vertical portions of the first and second active patterns AP1 and AP2, which are adjacent to each other. The deposition thickness of the first insulating layer 140 may be larger than half of the distance between the first and second word lines WL1 and WL2, which are adjacent to each other. Accordingly, the gap region may be formed between the vertical portions of the first and second active patterns AP1 and AP2.

The first insulating layer 140 may be formed using a deposition process having a good step coverage property, such as a chemical vapor deposition (CVD) and an atomic layer deposition (ALD). The first insulating layer 140 may be formed of or may include at least one of, for example, silicon oxide, silicon nitride, silicon oxynitride, and low-k dielectric materials.

Thereafter, referring to FIG. 23A, a capping insulating layer 150 may be formed on the first insulating layer 140. The capping insulating layer 150 may be formed using a deposition method having a poor step coverage property. For example, the capping insulating layer 150 may be formed using a physical vapor deposition method. The capping insulating layer 150 may be formed of the same insulating material as the first insulating layer 140 or may be formed of a low-k dielectric material whose dielectric constant is lower than the first insulating layer 140.

In the case where an overhang phenomenon occurs when the capping insulating layer 150 is deposited, a space between the vertical portions of the first and second active patterns AP1 and AP2, which are adjacent to each other, may not be completely filled with an insulating material. For example, the capping insulating layer 150 may block a top entrance of a gap region of the first insulating layer 140, and the air gap AG may be formed between the vertical portions of the first and second active patterns AP1 and AP2. In the case where a deposition process having a poor step coverage property is used, the air gap AG may be formed to expose the first insulating layer 140.

Next, a planarization process may be performed on the capping insulating layer 150 and the first insulating layer 140 to expose the top surfaces of the first and second active patterns AP1 and AP2. Accordingly, as shown in FIG. 7A, the first insulating pattern 141 may be formed between the first and second word lines WL1 and WL2, and the second insulating pattern 143 may be formed between the vertical portions of the first and second active patterns AP1 and AP2. The capping pattern 152, which is a portion of the capping insulating layer 150, may be formed near the uppermost ends of the second insulating pattern 143.

As an example, after the formation of the first insulating layer 140 as shown in FIG. 22, the capping insulating layer 150 may be deposited on the first insulating layer 140 to fill a portion of the gap region of the first insulating layer 140, as shown FIG. 23B.

The capping insulating layer 150 may be formed using a deposition process having a poor step coverage property. Accordingly, the deposition thickness of the capping insulating layer 150 on a side surface of the gap region of the first insulating layer 140 may be different from that on the top surface of the first insulating layer 140. The capping insulating layer 150 may be deposited on the first insulating layer 140 to form the air gap AG in the gap region of the first insulating layer 140.

Next, a planarization process may be performed on the capping insulating layer 150 and the first insulating layer 140 to expose the top surfaces of the first and second active patterns AP1 and AP2. Accordingly, as shown in FIG. 7B, the second insulating pattern 143 and the capping pattern 152 having the air gap AG may be formed between the first and second active patterns AP1 and AP2. The air gap AG may be an empty space, which is enclosed by the capping pattern 152.

As an example, after the formation of the first insulating layer 140 shown in FIG. 22, a shielding layer 160 may be formed on the first insulating layer 140 to fill the gap region, as shown in FIG. 23C.

The shielding layer 160 may be formed using an atomic layer deposition (ALD) process or a chemical vapor deposition (CVD) process. In the case where the shielding layer 160 is deposited on the first insulating layer 140 using the CVD process, a discontinuous interface (e.g., a seam) may be formed due to the step coverage property of the CVD process. Furthermore, if the step coverage property is poor in the CVD process, an over-hang issue may occur, and a void may be formed in the gap region, as shown in FIG. 7D.

The shielding layer 160 may be formed of or may include a metallic material (e.g., tungsten (W), titanium (Ti), nickel (Ni), or cobalt (Co)). As an example, the shielding layer 160 may be formed of or may include a two-dimensional conductive material (e.g., graphene).

After the formation of the shielding layer 160, a planarization process may be sequentially performed on the shielding layer 160 and the first insulating layer 140 to expose the top surfaces of the first and second active patterns AP1 and AP2. Accordingly, the first insulating pattern 141, the second insulating pattern 143, and the shielding pattern 162 may be formed, as shown in FIG. 7C.

According to an embodiment of the inventive concept, an active pattern, which is formed in a mirror symmetric manner, may be used to realize a vertical channel transistor. Accordingly, it may be possible to possible to increase an integration density of a semiconductor memory device.

Since an air gap or a shielding pattern is disposed between word lines or active patterns, which are adjacent to each other, a coupling noise between the adjacent word lines and/or between the adjacent active patterns may be decreased. When the semiconductor memory device is operated, it may be possible to prevent a leakage current from being increased in a selected transistor and an unselected transistor adjacent thereto.

Furthermore, an oxide semiconductor material may be used as the active pattern to reduce a leakage current of a transistor. Peripheral circuits may vertically overlap a cell array to increase an integration density of a semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
   a bit line extending in a first direction and comprising a metallic material;
   a plurality of first active patterns and a plurality of second active patterns alternately disposed in the first direction and overlapping the bit line, wherein each of the plurality of first and second active patterns includes a horizontal portion and a vertical portion vertically extended from one end of the horizontal portion, one of the plurality of first active patterns and one of the plurality of second active patterns, which are adjacent to each other, being disposed to be symmetric with respect to each other;
   a plurality of first word lines extending in a second direction different from the first direction and overlapping the bit line, each of the plurality of first word lines being disposed on a horizontal portion of a corresponding one of the plurality of first active patterns;
   a plurality of second word lines extending in the second direction and overlapping the bit line, each of the plurality of second word lines being disposed on a horizontal portion of a corresponding one of the plurality of second active patterns; and
   a plurality of intermediate structures, each intermediate structure being provided in at least one of a first gap region between a corresponding first word line of the plurality of first word lines and a corresponding second word line, adjacent to the corresponding first word line, of the plurality of second word lines, and a second gap region between a vertical portion of a corresponding first active pattern of the plurality of first active patterns and a vertical portion of a corresponding second active pattern, adjacent to the corresponding first active pattern, of the plurality of second active patterns.,
   wherein each of the plurality of intermediate structures comprises an air gap in at least one of the first and second gap regions and a capping pattern covering a top of the air gap.

2. The semiconductor memory device of claim 1,
   wherein the vertical portion of the corresponding first active pattern and the vertical portion of the corresponding second active pattern is disposed between the corresponding first word line and the corresponding second word line.

3. The semiconductor memory device of claim 1,
   wherein each of the plurality of first and second word lines has a first side surface and a second side surface, which are opposite to each other,
   wherein first side surfaces of each pair of first and second word lines among the plurality of first and second word lines are adjacent to vertical portions of a respective pair of first and second active patterns among the plurality of first and second active patterns, respectively,
   wherein second side surfaces of each pair of first and second word lines face each other, and
   wherein each pair of first and second word lines are disposed between the respective pair of first and second active patterns.

4. The semiconductor memory device of claim 1,
   wherein top surfaces of the corresponding first and second word lines are located at a level lower than top surfaces of the vertical portions of the corresponding first and second active patterns.

5. The semiconductor memory device of claim 1,
   wherein the bit line has a first width in the second direction,
   wherein the horizontal portion of the corresponding first active pattern has a second width in the second direction, and
   wherein the second width is larger than the first width.

6. The semiconductor memory device of claim 1,
   wherein one of the plurality of first word lines and one of the plurality of second word lines, which are adjacent to each other, are spaced apart from each other by a first distance, and
   wherein a vertical portion of one of the plurality of first active patterns and a vertical portion of one of the plurality of second active patterns, which are adjacent to each other, are spaced apart from each other by a second distance that is different from the first distance.

7. The semiconductor memory device of claim 6,
   wherein the second distance is smaller than the first distance.

8. A semiconductor memory device, comprising:
   a bit line extending in a first direction;
   a plurality of active patterns disposed in the first direction and overlapping the bit line, wherein each of the plurality of active patterns includes a horizontal portion and a vertical portion, the horizontal portion extending along the bit line and the vertical portion vertically extending from one end of the horizontal portion;
a plurality of first word lines extending in a second direction different from the first direction and overlapping the bit line, each of the plurality of first word lines being disposed on an upper surface of a horizontal portion of a corresponding one of the plurality of active patterns, wherein the upper surface of the horizontal portion is higher than an upper surface of the bit line; and
a plurality of second word lines extending in the second direction and overlapping the bit line, each of the plurality of second word lines being disposed on an upper surface of a horizontal portion of a corresponding one of the plurality of active patterns;
a first insulating pattern filling a space between the pair of one of the plurality of first word lines and one of the plurality of second word lines, which are adjacent to each other;
a second insulating pattern filling a space between the vertical portions of the pair of active patterns, which are adjacent to each other; and
a shielding pattern disposed in a space defined by the second insulating pattern and between the vertical portions of the pair of active patterns, which are adjacent to each other,
wherein a pair of one of the plurality of first word lines and one of the plurality of second word lines, which are adjacent to each other, are spaced apart from each other by a first distance, and
wherein vertical portions of a first pair of active patterns of the plurality of active patterns, which are adjacent to each other, are spaced apart from each other by a second distance that is larger than the first distance.

9. The semiconductor memory device of claim 8, wherein the shielding pattern comprises a metallic material or a two-dimensional conductive material.

10. The semiconductor memory device of claim 8, wherein the shielding pattern extends in the second direction.

11. The semiconductor memory device of claim 8, further comprising:
a first insulating pattern filling a space between the pair of one of the plurality of first word lines and one of the plurality of second word lines, which are adjacent to each other; and
a second insulating pattern filling a space between the vertical portions of the pair of active patterns, which are adjacent to each other,
wherein a dielectric constant of the second insulating pattern is lower than a dielectric constant of the first insulating pattern.

12. The semiconductor memory device of claim 8, wherein top surfaces of the pair of one of the plurality of first word lines and one of the plurality of second word lines are located at a level lower than top surfaces of the vertical portions of the pair of active patterns.

13. The semiconductor memory device of claim 8, further comprising:
a plurality of first data storage patterns connected to a plurality of first active patterns of the plurality of active patterns, respectively; and
a plurality of second data storage patterns connected to a plurality of second active patterns of the plurality of active patterns, respectively.

14. The semiconductor memory device of claim 13, further comprising:
a plurality of first landing pads, each first landing pad being disposed between a corresponding one of the plurality of first active patterns and a corresponding one of the plurality of first data storage patterns; and
a plurality of second landing pads, each second landing pad being disposed between a corresponding one of the plurality of second active patterns and a corresponding one of the plurality of second data storage patterns.

15. A semiconductor memory device, comprising:
a peripheral circuit structure including a plurality of peripheral circuits on a semiconductor substrate and a lower insulating layer covering the plurality of peripheral circuits;
a plurality of bit lines provided on the peripheral circuit structure and extended in a first direction;
a plurality of first active patterns and a plurality of second active patterns alternately disposed in the first direction and overlapping a first bit line of the plurality of bit lines, wherein each of the plurality of first and second active patterns includes a horizontal portion and a vertical portion;
a plurality of first word lines extending in a second direction different from the first direction and overlapping the plurality of bit lines, each of the plurality of first word lines being disposed on a horizontal portion of a corresponding one of the plurality of first active patterns;
a plurality of second word lines extending in the second direction and overlapping the plurality of bit lines, each of the plurality of second word lines being disposed on a horizontal portion of a corresponding one of the plurality of second active patterns;
a plurality of first gate insulating patterns, each first gate insulating pattern being disposed between a corresponding one of the plurality of first active patterns and a first side surface of a corresponding one of the plurality of first word lines and between the corresponding one of the plurality of first active patterns and a bottom surface of the corresponding one of the plurality of first word lines;
a plurality of second gate Insulating patterns, each second gate Insulating pattern being disposed between a corresponding one of the plurality of second active patterns and a second side surface of a corresponding one of the plurality of second word lines and between the corresponding one of the plurality of second active patterns and a bottom surface of the corresponding one of the plurality of second word lines;
a first Insulating pattern filling a space between a pair of one the plurality of first word lines and one of the plurality of second word lines, which are adjacent to each other;
a second insulating pattern defining an air gap between vertical portions of a pair of one of the plurality of first active patterns and one of the plurality of second active patterns, which are adjacent to each other;
an interlayer insulating layer disposed on the first and second insulating patterns to cover top surfaces of the plurality of first and second active patterns;
a plurality of landing pads provided to penetrate the interlayer insulating layer,
wherein each landing pad is connected to a vertical portion of a corresponding one of the plurality of first and second active patterns; and a plurality of data storage patterns on the plurality of landing pads, respectively.

* * * * *